US012805348B2

(12) United States Patent
Kuramochi

(10) Patent No.: US 12,805,348 B2
(45) Date of Patent: Nov. 17, 2026

(54) THROUGH VIA SUBSTRATE

(71) Applicant: DAI NIPPON PRINTING CO., LTD., Tokyo (JP)

(72) Inventor: Satoru Kuramochi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 366 days.

(21) Appl. No.: 18/276,907

(22) PCT Filed: Feb. 15, 2022

(86) PCT No.: PCT/JP2022/005968
§ 371 (c)(1),
(2) Date: Aug. 11, 2023

(87) PCT Pub. No.: WO2022/173057
PCT Pub. Date: Aug. 18, 2022

(65) Prior Publication Data

US 2024/0339389 A1 Oct. 10, 2024

(30) Foreign Application Priority Data

Feb. 15, 2021 (JP) ................................ 2021-021523

(51) Int. Cl.
*H10W 70/63* (2026.01)
*H10W 70/69* (2026.01)

(52) U.S. Cl.
CPC ......... *H10W 70/635* (2026.01); *H10W 70/69* (2026.01)

(58) Field of Classification Search
CPC ................................................ H01L 23/49827
(Continued)

(56) References Cited

U.S. PATENT DOCUMENTS

2019/0313524 A1* 10/2019 Huang .................. H05K 3/388
2021/0009463 A1* 1/2021 Takane ................ H05K 1/0306

FOREIGN PATENT DOCUMENTS

JP 2015-095590 A 5/2015
JP 2017-228846 A 12/2017
(Continued)

OTHER PUBLICATIONS

Korean Office Action issued on Apr. 21, 2025, for the corresponding Korean Patent Application No. 10-2023-7030240, with English machine translation.
(Continued)

*Primary Examiner* — Ajay Arora
(74) *Attorney, Agent, or Firm* — Michael Best & Friedrich LLP

(57) ABSTRACT

A through-electrode substrate including a through-electrode adapted for high density and miniaturization and capable of reducing a transmission loss at a high frequency is provided. A through-electrode substrate according to the present disclosure includes a substrate having a first face and a second face opposite to the first face and having a through-hole extending from the first face to the second face, and a through-electrode located in the through-hole of the substrate. A hole diameter of the through-hole varies according to a position in a thickness direction of the substrate. The through-hole has a minimum diameter part having a minimum hole diameter of greater than or equal to 10 μm. A maximum hole diameter of the through-hole is less than or equal to 60 μm. The through-electrode has an adhesion layer and a conductive layer in order from a side face of the through-hole toward a center of the through-hole. A dielectric loss tangent of the substrate at a frequency of 20 GHz is greater than or equal to 0.0003 and less than or equal to 0.0005.

14 Claims, 14 Drawing Sheets

(58) Field of Classification Search
USPC .......................................................... 257/678
See application file for complete search history.

(56) References Cited

FOREIGN PATENT DOCUMENTS

| | | | |
|---|---|---|---|
| JP | 2018-163986 | A | 10/2018 |
| JP | 2021-002779 | A | 1/2021 |
| JP | 2021-011411 | A | 2/2021 |
| KR | 20140044746 | A1 | 4/2014 |
| KR | 10-2015-0007982 | A | 1/2015 |
| KR | 20150007982 | A1 | 1/2015 |
| KR | 20160052423 | A1 | 5/2016 |
| KR | 10-2019-0093612 | A | 8/2019 |
| WO | 2017/061727 | A1 | 4/2017 |
| WO | 2018-92480 | A1 | 5/2018 |
| WO | 2019-199677 | A2 | 10/2019 |
| WO | 2020/022129 | A1 | 1/2020 |

OTHER PUBLICATIONS

Japanese Notice of Termination of Reconsideration by Examiners before Appeal Proceedings for Patent Application No. 2022-580720 issued on Jul. 22, 2025, with machine English translation.

Japanese Reconsideration Report by Examiner before Appeal for Patent Application No. 2022-580720 drafted on Jul. 25, 2025, with machine English translation.

Korean Office Action issued on Jan. 21, 2026 for the corresponding Korean Patent Application No. 10-2023-7030240, with English machine translation.

International Search Report mailed on May 17, 2022 for the corresponding PCT Application No. PCT/JP2022/005968, with English machine translation.

English translation of the International Preliminary Report on Patentability, issued on Aug. 15, 2023, for the corresponding PCT Application No. PCT/JP2022/005968.

* cited by examiner

THROUGH VIA SUBSTRATE

TECHNICAL FIELD

The present invention relates to a through-electrode substrate including a through-electrode.

BACKGROUND ART

A through-electrode substrate, as described in, for example, PTL 1, includes a substrate having a first face and a second face, a plurality of through-holes provided in the substrate, and through-electrodes respectively provided in the through-holes so as to extend through from the first face side of the substrate to the second face side of the substrate. Hitherto, such through-electrode substrates are used in various applications. For example, through-electrode substrates are used in various electronic apparatuses from small apparatuses like smartphones down to large apparatuses like large-scale servers.

The through-electrodes of through-electrode substrates are generally classified into a filled type (also referred to as filled vias) and an unfilled type (also referred to as conformal vias). In a filled via, electrically conductive material fills the entire through-hole. In a conformal via, electrically conductive material is provided on the side face of a through-hole, and the central part of the through-hole is hollow.

For example, a method in which a seed layer is formed on the side face of a through-hole and a plating layer is formed on the seed layer by electrolytic plating is known as a method of forming a through-electrode.

CITATION LIST

Patent Literature

PTL 1: Japanese Unexamined Patent Application Publication No. 2018-163986

SUMMARY OF INVENTION

An LSI device implemented on or in a through-electrode substrate is remarkably highly integrated. With high integration, high density and miniaturization are also desired for through-electrodes provided in through-electrode substrates. Furthermore, LSI devices in recent years use higher frequencies associated with faster operations. High-frequency transmission losses of through-electrode substrates in which such LSI devices are implemented are becoming problematic.

It is a main object of the present disclosure to provide a through-electrode substrate that can effectively solve the above-described problem.

An embodiment of the present disclosure is a through-electrode substrate. The through-electrode substrate includes a substrate having a first face and a second face opposite to the first face and having a through-hole extending from the first face to the second face, and a through-electrode located in the through-hole of the substrate. A hole diameter of the through-hole varies according to a position in a thickness direction of the substrate. The through-hole has a minimum diameter part having a minimum hole diameter of greater than or equal to 10 μm. A maximum hole diameter of the through-hole is less than or equal to 60 μm. The through-electrode has an adhesion layer and a conductive layer in order from a side face of the through-hole toward a center of the through-hole. The substrate has a dielectric loss tangent of greater than or equal to 0.0003 and less than or equal to 0.0005 at a frequency of 20 GHz.

In the through-electrode substrate according to an embodiment of the present disclosure, the through-hole may have a narrowed part that is the minimum diameter part located between the first face and the second face, and a hole diameter at the narrowed part may be greater than or equal to 10 μm, a hole diameter at the first face may be less than or equal to 60 μm, and a hole diameter at the second face may be less than or equal to 60 μm.

In the through-electrode substrate according to an embodiment of the present disclosure, the adhesion layer may contain any one of titanium (Ti), titanium nitride (TiN), and zinc oxide (ZnO).

In the through-electrode substrate according to an embodiment of the present disclosure, the conductive layer may contain copper (Cu).

In the through-electrode substrate according to an embodiment of the present disclosure, the through-hole may be sealed with a conductive material at the first face side of the substrate or the second face side of the substrate.

In the through-electrode substrate according to an embodiment of the present disclosure, an inside of the through-hole may be filled with a conductive material, the conductive material may have a first face-side recess at the first face side of the substrate and a second face-side recess at the second face side of the substrate, a depth of the first face-side recess from the first face of the substrate may be greater than or equal to 0.1 μm and less than or equal to 5 μm, and a depth of the second face-side recess from the second face of the substrate may be greater than or equal to 0.1 μm and less than or equal to 5 μm.

In the through-electrode substrate according to an embodiment of the present disclosure, an inside of the through-hole may be filled with a resin material, and the resin material may have a dielectric loss tangent of greater than or equal to 0.003 and less than or equal to 0.02 at a frequency of 20 GHz.

In the through-electrode substrate according to an embodiment of the present disclosure, a resin layer made of the resin material may be formed on at least one of the first face side of the substrate and the second face side of the substrate, and the resin layer may have an opening at a position that overlaps the through-electrode in a plan view.

The through-electrode substrate according to an embodiment of the present disclosure may include an insulating resin layer provided on at least one of the first face side of the substrate and the second face side of the substrate, and the insulating resin layer may include a resin material having a dielectric loss tangent of greater than or equal to 0.001 and less than or equal to 0.01 at a frequency of 20 GHz.

In the through-electrode substrate according to an embodiment of the present disclosure, the insulating resin layer may have an opening at a position that overlaps the through-electrode in a plan view.

In the through-electrode substrate according to an embodiment of the present disclosure, the minimum diameter part may have a minimum hole diameter of greater than or equal to 25 μm.

In the through-electrode substrate according to an embodiment of the present disclosure, any one of a distance from the first face to the minimum diameter part in the thickness direction of the substrate and a distance from the second face to the minimum diameter part in the thickness direction may be less than or equal to 50 μm.

In the through-electrode substrate according to an embodiment of the present disclosure, a content of silicon dioxide in the substrate may be higher than or equal to 90 wt %.

In the through-electrode substrate according to an embodiment of the present disclosure, the through-electrode may contain copper, and a volume fraction of copper in the through-hole may be lower than or equal to 50%.

In the through-electrode substrate according to an embodiment of the present disclosure, a surface roughness of the side face of the through-hole may be less than or equal to 5 nm.

According to the present disclosure, it is possible to provide a through-electrode substrate including a through-electrode adapted for high density and miniaturization and capable of reducing a transmission loss at a high frequency.

DESCRIPTION OF EMBODIMENTS

Hereinafter, a through-electrode substrate according to an embodiment of the present disclosure will be described in detail with reference to the attached drawings. Embodiments described below are examples of the embodiment of the present disclosure, and the present disclosure should not be interpreted limitedly to these embodiments. In the specification, the terms such as "substrate" and "board" are not distinguished from each other by the difference in name. Furthermore, terms, such as "parallel" and "orthogonal", values of length and angle, and the like that determine shapes, geometrical conditions and the degrees of them, used in the specification, are not limited to strict meanings and are interpreted so as to include the range of degrees to which similar functions can be expected. In the attached drawings to be referenced in the present embodiments, the same or similar reference signs denote the same portions or portions having similar functions, and the repeated description can be omitted. The scale ratio of the drawings can be different from the actual ratio for the sake of convenience of illustration, and a portion of components can be omitted from the drawings.

First Embodiment

Initially, a through-electrode substrate 1 according to an embodiment of the through-electrode substrate according to the present disclosure will be described with reference to FIGS. 1A and 2. Here, FIG. 1A is a schematic sectional view showing an example of a relevant part of the through-electrode substrate 1, and FIG. 2 is a schematic sectional view of a substrate that is a component of the through-electrode substrate 1 shown in FIG. 1A.

Figure 1A:
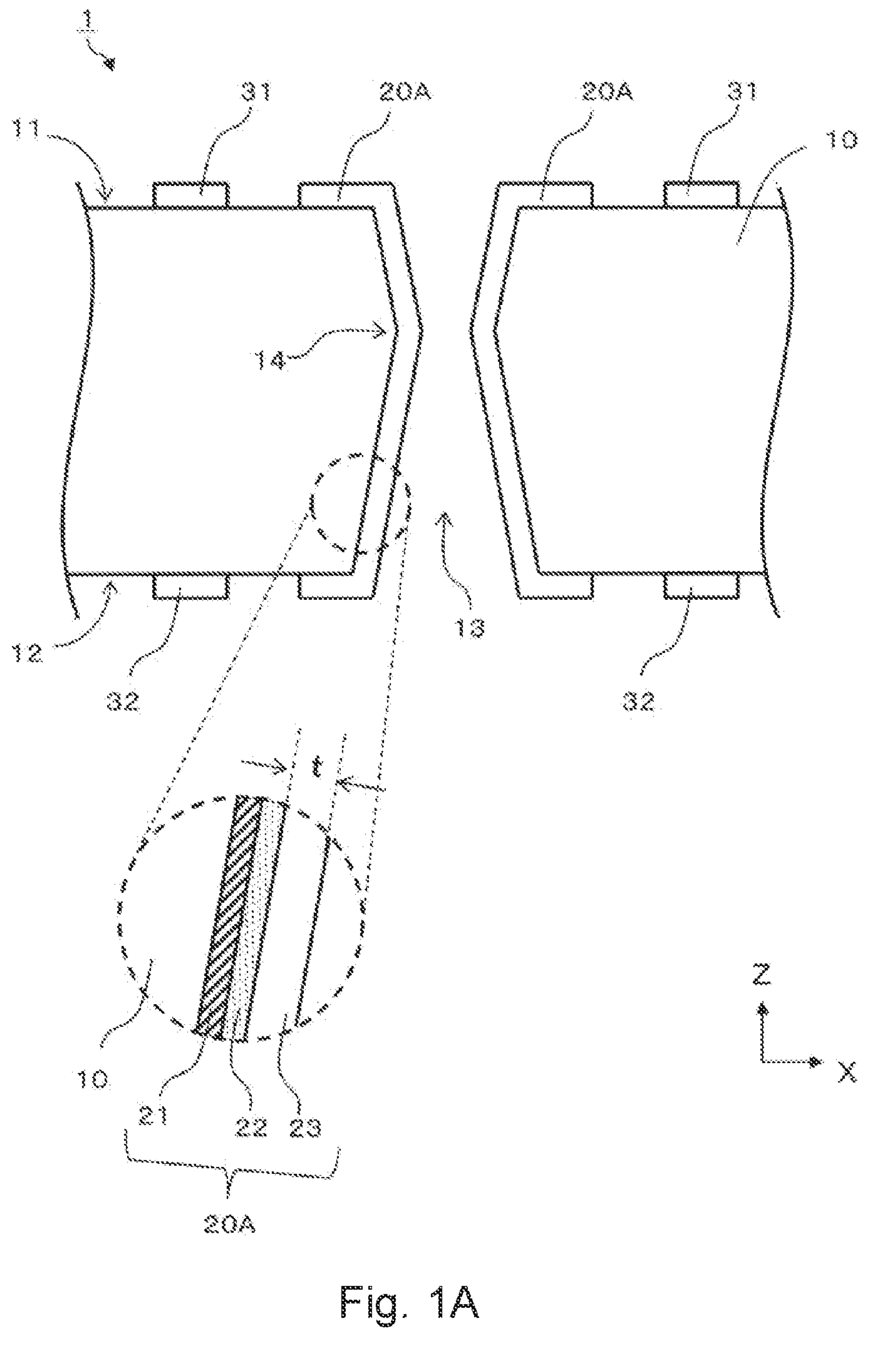
FIG. 1A is a schematic sectional view showing an example of a through-electrode substrate according to the present disclosure.

As shown in FIG. 1A, the through-electrode substrate 1 includes a substrate 10 having a through-hole 13 and a through-electrode 20A located in the through-hole 13 of the substrate 10. The through-electrode substrate 1 has first face-side wires 31 on the first face 11 side and second face-side wires 32 on the second face 12 side.

Figure 2:
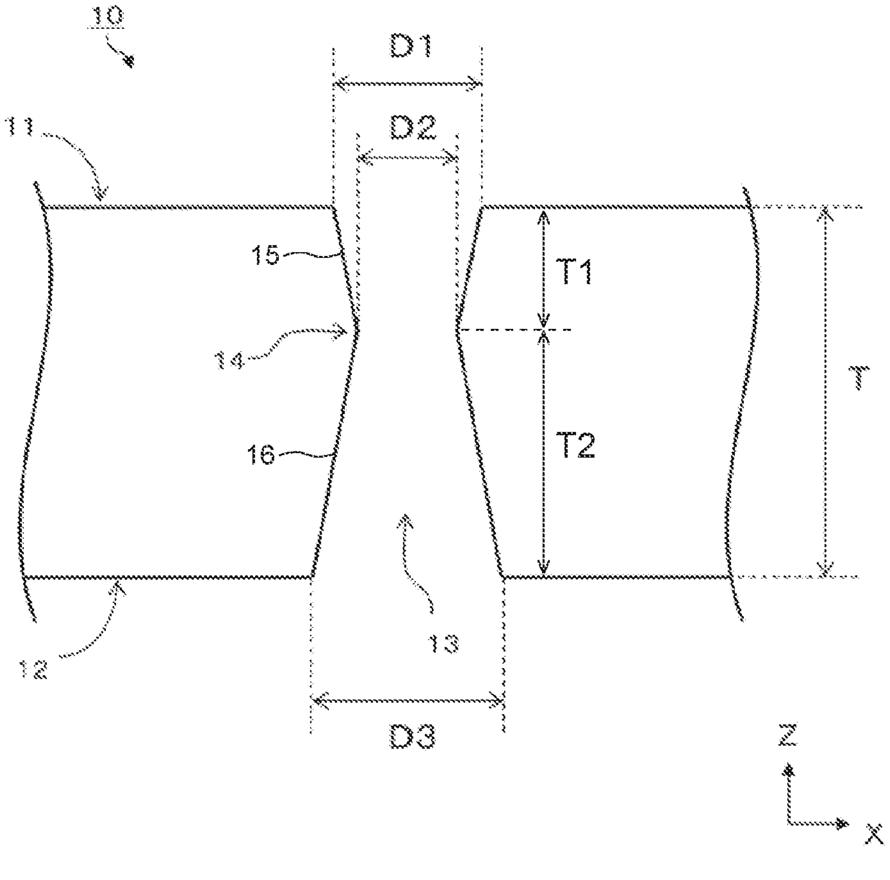
FIG. 2 is a schematic sectional view of a substrate that is a component of the through-electrode substrate shown in FIG. 1A.

As shown in FIG. 2, the substrate 10 has the first face 11 and the second face 12 opposite to the first face 11. The substrate 10 has the through-hole 13 that extends from the first face 11 to the second face 12.

The hole diameter of the through-hole 13 may vary according to a position in the thickness direction of the substrate 10. The through-hole 13 has a narrowed part 14 between the first face 11 and the second face 12. In the present embodiment, the hole diameter of the through-hole 13 is minimum at the narrowed part 14. The hole diameter (D2 shown in FIG. 2) of the through-hole 13 at the narrowed part 14 is less than the hole diameter (D1 shown in FIG. 2) at the first face 11 and less than the hole diameter (D3 shown in FIG. 2) at the second face 12.

FIG. 1A shows an enlarged sectional view of a through-electrode (through-electrode 20A) formed in one through-hole 13 of the through-electrode substrate 1 in an example. Ordinarily, a plurality of through-holes is formed in the through-electrode substrate 1, and a through-electrode is provided in each through-hole.

Hereinafter, the component elements of the through-electrode substrate 1 will be described.

(Substrate)

The substrate 10 contains a material having certain electrical insulation properties. Examples of the material that is a component of the substrate 10 may include fluororesins, various ceramics, various glasses, quartz, and synthetic quartz.

In the present disclosure, a dielectric loss tangent of the substrate 10 at a high frequency is preferably smaller as much as possible. This is because a transmission loss at a high frequency of the through-electrode substrate 1 made up of the substrate 10 can be reduced. The phrase "a transmission loss is small" means that the value of transmission loss is a value closer to 0 (zero).

However, substrates having a small dielectric loss tangent tend to be expensive. For this reason, the substrate 10 is selected in consideration of the value of dielectric loss tangent and costs.

From the above-described viewpoint, in the present disclosure, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

The content of silicon dioxide ($SiO_2$) in the substrate 10 is, for example, higher than or equal to 90 wt % or may be higher than or equal to 95 wt %. Thus, it is possible to reduce the dielectric loss tangent of the substrate 10 at a high frequency. On the other hand, as the content of silicon dioxide ($SiO_2$) increases, the price of substrates presumably increases. For example, the substrate 10 containing quartz is generally more expensive than the substrate 10 containing synthetic quartz. In consideration of this point, the content of silicon dioxide ($SiO_2$) in the substrate 10 may be lower than or equal to 99 wt % or may be lower than or equal to 98 wt %. The content of silicon dioxide ($SiO_2$) in the substrate 10 is measured by energy dispersive X-ray spectroscopy (EDS).

The substrate 10 preferably has a small thermal expansion coefficient. The thermal expansion coefficient of the substrate 10 is, for example, larger than or equal to 0.5 ppm and smaller than or equal to 1.0 ppm.

The thickness (T shown in FIG. 2) of the substrate 10 is preferably thinner in terms that the hole diameters of through-holes can be reduced; whereas it is disadvantageous in terms of strength.

A manufacturing process for the through-electrode substrate 1 includes a polishing step, typically, a chemical mechanical polishing (CMP) step; however, if the thickness of the substrate 10 is too thin, the through-electrode substrate 1 may be broken in the polishing step.

For this reason, the thickness of the substrate 10 is preferably, for example, greater than or equal to 300 μm and less than or equal to 500 μm.

(Through-Hole)

As shown in FIG. 2, the substrate 10 has the through-hole 13 that extends from the first face 11 to the second face 12. The through-hole 13 has the narrowed part 14 having a minimum hole diameter between the first face 11 and the second face 12. The hole diameter (D2 shown in FIG. 2) of the through-hole 13 at the narrowed part 14 is less than the hole diameter (D1 shown in FIG. 2) at the first face 11 and less than the hole diameter (D3 shown in FIG. 2) at the second face 12.

In other words, in a sectional view, the side face of the through-hole 13 formed in the substrate 10 includes a first tapered part 15 that tapers from the first face 11 of the substrate 10 toward the narrowed part 14 and a second tapered part 16 that tapers from the second face 12 of the substrate 10 toward the narrowed part 14. The first tapered part 15 and the second tapered part 16 are connected at the narrowed part 14.

The form of each of the first face 11 side and the second face 12 side of the through-hole 13 in a plan view is ordinarily a circular shape. The form of the cross section of the through-hole 13 is ordinarily a circular shape. Therefore, the through-hole 13 can be expressed as a form obtained by connecting two circular truncated cones. The first circular truncated cone and the second circular truncated cone each have a lower base and an upper base having a smaller area than the lower base. The shape of the through-hole 13 is implemented by connecting the upper base of the first circular truncated cone and the upper base of the second circular truncated cone. In this case, the connected upper bases correspond to the narrowed part 14.

The above-described tapered shape means a "taper" when put in perspective. In the example of the sectional view of the through-hole 13, shown in FIG. 2, the first tapered part 15 and the second tapered part 16 of the side face extend linearly. Although not shown in the drawing, the first tapered part 15 and the second tapered part 16 of the side face may extend in a curved line or may partially include a curved part or may have a linear part and a curved part. As will be described later, the side face of the through-hole 13 may have small asperities. In these cases as well, these shapes are included in the concept of the tapered shape as long as these shapes are "tapers" when put in perspective.

Since the through-hole 13 has the above-described form, both the hole diameter of the through-hole 13 at the first face 11 side and the hole diameter of the through-hole 13 at the second face 12 side can be effectively reduced. A reason for this will be described below.

A manufacturing process for a through-electrode substrate may include a step of increasing the thickness of a through-electrode by electrolytic plating. In this case, the manufacturing process for a through-electrode substrate may include a step of forming a seed layer. In the step of forming a seed layer, when, for example, the inclination of the side face of a through-hole is close to an upright, a seed layer with a necessary film thickness may not be formed at a position away from the first face 11 or the second face 12 if the seed layer is formed by sputtering. Therefore, a through-electrode formed by electrolytic plating thereafter may not have a desired thickness. For this reason, the side face of the through-hole preferably has a form having an inclination with respect to an upright.

The form of the through-hole in a case where the side face of the through-hole has an inclination presumably includes a form in which the through-hole has the narrowed part 14 between the first face 11 and the second face 12 and a form in which the through-hole has no narrowed part 14. In the form in which the through-hole has no narrowed part 14, the size of the hole diameter at the first side (for example, the first face 11 side) is different from the size of the hole diameter at the second side (for example, the second face 12 side). Then, with an increase in the thickness of the substrate 10, a difference between the size of the hole diameter at the first side (for example, the first face 11 side) and the size of the hole diameter at the second side (for example, the second face 12 side) increases.

On the other hand, in a form in which the narrowed part 14 is formed as in the case of the through-hole 13, a difference between the size of the hole diameter at the first side (for example, the first face 11 side) and the size of the hole diameter at the second side (for example, the second face 12 side) can be reduced. In other words, it is possible to effectively reduce both the hole diameter of the through-hole 13 at the first face 11 side and the hole diameter of the through-hole 13 at the second face 12 side.

Therefore, in a form as in the case of the through-hole 13, a larger number of through-holes can be formed in the substrate 10. In other words, in the through-electrode substrate 1, it is possible to further increase the number of through-electrodes per unit area, so it is possible to increase the distribution density of through-electrodes of the through-electrode substrate 1.

In a form as in the case of the through-hole 13, it is possible to effectively reduce both the hole diameter of the through-hole 13 at the first face 11 side and the hole diameter of the through-hole 13 at the second face 12 side. Therefore, it is possible to further miniaturize the through-electrodes of the through-electrode substrate 1.

As the hole diameter D1 at the first face 11 and the hole diameter D3 at the second face 12 reduce, the distribution density of the through-electrodes of the through-electrode substrate 1 can be increased, and the through-electrodes can be miniaturized. However, since the hole diameter D2 at the narrowed part 14 is less than the hole diameter D1 or the hole diameter D3, difficulty in manufacturing increases.

From the above-described viewpoint, in the present disclosure, preferably, the hole diameter D2 at the narrowed part 14 is greater than or equal to 10 μm, the hole diameter D1 at the first face 11 is less than or equal to 60 μm, and the hole diameter D3 at the second face 12 is less than or equal to 60 μm.

When the hole diameter D1 and the hole diameter D3 are less than or equal to 60 μm, it is possible to increase the distribution density of through-electrodes in a plan view. For example, an array pitch of through-electrodes in a plan view can be made less than or equal to 100 μm. At least one of the difference between the hole diameter D1 and the hole diameter D2 and the difference between the hole diameter D3 and the hole diameter D2 is preferably greater than or equal to 10 μm.

The hole diameter D2 at the narrowed part 14 will be described in detail. As the hole diameter D2 is too small, defects presumably occur in a step of forming through-electrodes. For example, in a step of forming a seed layer by electroless plating, a liquid membrane is presumably easily formed at the narrowed part 14. When a liquid membrane is formed at the narrowed part 14, a seed layer is difficult to precipitate at the narrowed part 14. For this reason, in electrolytic plating thereafter, presumably, the thickness of the conductive layer 23 (described later) partially reduces or the conductive layer 23 is partially not formed. In consideration of this point, the hole diameter D2 is, for example, greater than or equal to 25 μm, may be greater than or equal to 28 μm, or may be greater than or equal to 30 μm.

On the other hand, if the hole diameter D2 is too large, the flexibility of the layout of through-electrodes in a plan view presumably decreases. The hole diameter D1 at the first face 11 is greater than the hole diameter D2 at the narrowed part 14. For this reason, when a minimum value of the interval between adjacent two through-electrodes in a plan view is determined, as the hole diameter D2 increases, the hole diameter D1 also increases, so the number of through-electrodes per unit area at the first face 11 reduces. In other words, as the hole diameter D2 increases, the distribution density of through-electrodes is difficult to be increased. Similarly, as the hole diameter D2 increases, the number of through-electrodes per unit area at the second face 12 reduces. In consideration of this point, the hole diameter D2 is, for example, less than or equal to 50 μm, may be less than or equal to 45 μm, or may be less than or equal to 40 μm.

More specifically, for example, a mode in which the hole diameter D1 at the first face 11 is 40 μm, the hole diameter D2 at the narrowed part 14 is 25 μm, and the hole diameter D3 at the second face 12 is 50 μm may be a preferred mode.

The example shown in FIG. 2 shows a mode example in which the hole diameter D1 at the first face 11 is less than the hole diameter D3 at the second face 12 (that is, the example of D1<D3); however, the embodiment of the present disclosure is not limited thereto. For example, the sizes of both may be the same (that is, D1=D3). For example, the hole diameter of the through-hole 13 at the first face 11 side may be greater than the hole diameter at the second face 12 side (that is, D1>D3). These modifications may be applied not only to the first embodiment of the present disclosure but also to second to seventh embodiments described later.

In FIG. 2, a distance T1 represents a distance from the first face 11 to the narrowed part 14 in the thickness direction of the substrate 10. A distance T2 is a distance from the second face 12 to the narrowed part 14 in the thickness direction of the substrate 10. A smaller one of the distance T1 and the distance T2 is also referred to as a depth position of the narrowed part 14. In the example shown in FIG. 2, the distance T1 is less than the distance T2. Therefore, the distance T1 corresponds to the depth position of the narrowed part 14.

If the depth position of the narrowed part 14 is too large, defects presumably occur in a step of forming through-electrodes. For example, in a step of forming a seed layer by electroless plating, a liquid membrane is presumably easily formed at the narrowed part 14. In consideration of this point, the depth position of the narrowed part 14 is, for example, less than or equal to 50 μm, may be less than or equal to 40 μm, may be less than or equal to 35 μm, or may be less than or equal to 30 μm.

The example shown in FIG. 2 shows a mode example in which the position of the narrowed part 14 in the thickness direction of the substrate 10 is located adjacent to the first face 11 side with respect to a center position in the thickness direction of the substrate 10. In other words, the distance T1 is less than the distance T2. Although not shown in the drawing, the embodiment of the present disclosure is not limited thereto. For example, the position of the narrowed part 14 may be the center position in the thickness direction of the substrate 10. In other words, the distance T1 and the distance T2 may be equal to each other. For example, the position of the narrowed part 14 may be on the second face 12 side with respect to the center position in the thickness direction of the substrate 10. In other words, the distance T2 may be less than the distance T1. These modifications may also be applied not only to the first embodiment of the present disclosure but also to the second to seventh embodiments described later.

[Other Modes of Through-Hole]

Figure 13:
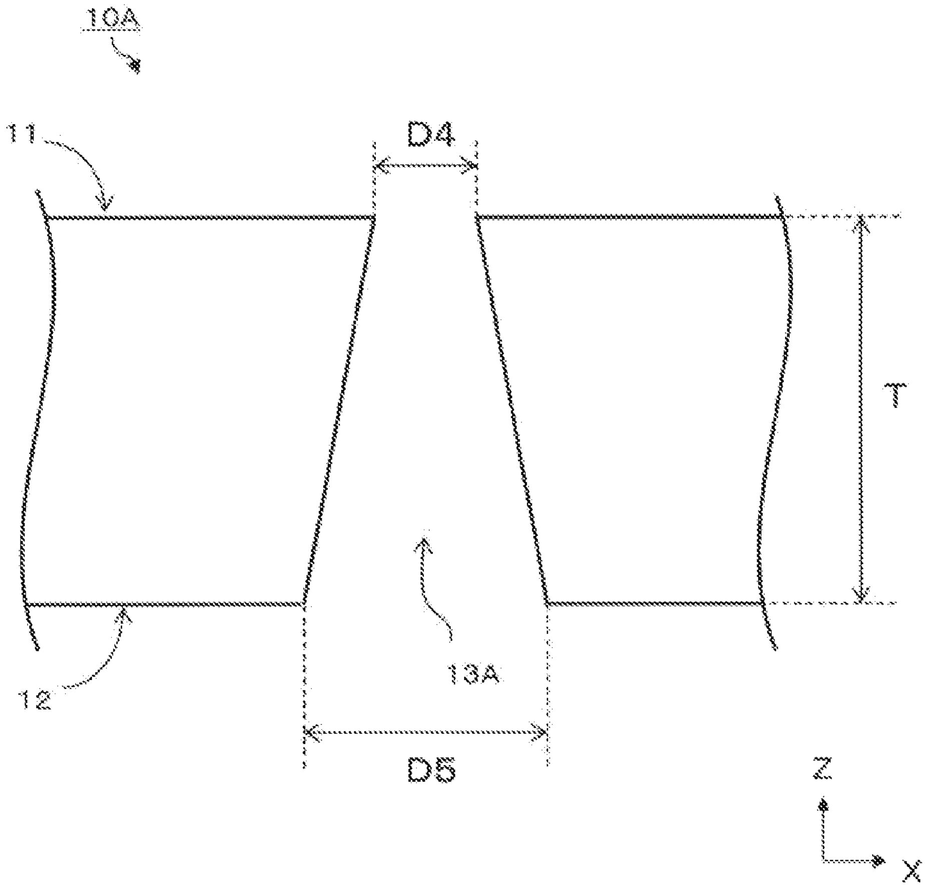
FIG. 13 is a schematic sectional view showing another example of the substrate that is a component of the through-electrode substrate.

As shown in FIG. 13, the through-hole of the substrate that is a component of the through-electrode substrate according to the present disclosure may be a mode in which no narrowed part of which the hole diameter is minimum is provided between the first face 11 and the second face 12. This applies not only to the first embodiment of the present disclosure but also to the second to seventh embodiments described later.

For example, in a mode shown in FIG. 13, in a sectional view, the side face of a through-hole 13A formed in a substrate 10A has a tapered shape that tapers from the second face 12 of the substrate 10A toward the first face 11. Then, the hole diameter of the through-hole 13A is such that the hole diameter at the first face 11 side (D4 shown in FIG. 13) is minimum and the hole diameter at the second face 12 side (D5 shown in FIG. 13) is maximum.

In such a mode as well, to provide a through-electrode substrate including through-electrodes adapted for high density and miniaturization, the hole diameter of the through-hole 13A is preferably set such that the minimum hole diameter is greater than or equal to 10 μm and the maximum hole diameter is less than or equal to 60 μm. In other words, in the mode shown in FIG. 13, preferably, the hole diameter of the through-hole 13A at the first face 11 side (D4 shown in FIG. 13) is greater than or equal to 10 μm, and the hole diameter at the second face 12 side (D5 shown in FIG. 13) is less than or equal to 60 μm.

More specifically, a mode in which the hole diameter of the through-hole 13A at the first face 11 side is 30 μm and the hole diameter at the second face 12 side is 45 μm may be a preferred mode in the substrate 10A shown in FIG. 13.

The example shown in FIG. 13 shows a mode example in which the hole diameter (D4 shown in FIG. 13) of the through-hole 13A at the first face 11 side is less than the hole diameter (D5 shown in FIG. 13) at the second face 12 side (that is, D4<D5); however, the embodiment of the present disclosure is not limited thereto. For example, the hole diameter of the through-hole 13 at the first face 11 side may be greater than the hole diameter at the second face 12 side (that is, D4>D5). This also applies not only to the first embodiment of the present disclosure but also to the second to seventh embodiments described later.

Parts of the through-holes 13, 13A having a minimum hole diameter are also referred to as minimum diameter parts. In the example shown in FIGS. 1 and 2, the narrowed part 14 of the through-hole 13 is a minimum diameter part. In the example shown in FIG. 13, a part of the through-hole 13A, located at the first face 11, is a minimum diameter part.

(Through-Electrode)

The through-electrode 20A is located in the through-hole 13 of the substrate 10 and is made of a material having electrical conductivity.

In the through-electrode substrate 1 shown in FIG. 1A, the through-electrode 20A is formed along the side face of the through-hole 13 from the first face 11 of the substrate 10 to the second face 12 of the substrate 10, and the center side of the through-hole 13 is hollow. In other words, the through-electrode 20A is in a form called a conformal via.

As shown in FIG. 1A in an enlarged view, the through-electrode 20A is made up of a plurality of layers. The through-electrode 20A includes an adhesion layer 21, a seed layer 22, and a conductive layer 23 in order from the side face of the through-hole 13 toward the center of the through-hole 13.

Figure 1B:
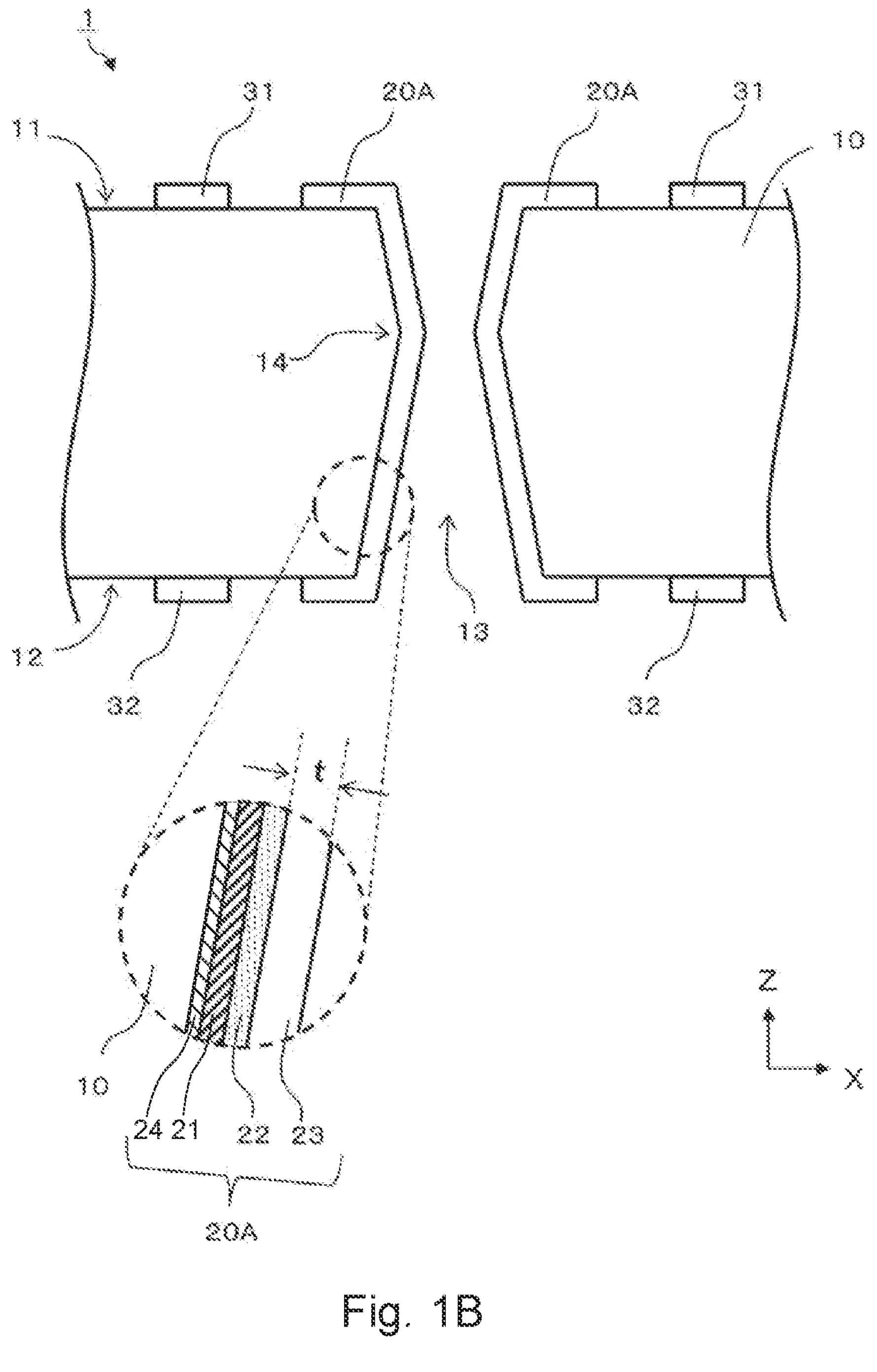
FIG. 1B is a schematic sectional view showing an example in which the through-electrode substrate includes a diffusion inhibition layer.

FIG. 1B is a sectional view showing another example of the through-electrode 20A. The through-electrode 20A may include a diffusion inhibition layer 24, an adhesion layer 21, a seed layer 22, and a conductive layer 23 in order from the side face of the through-hole 13 toward the center of the through-hole 13.

The adhesion layer 21 is provided between the substrate 10 and the seed layer 22 and provides the effect of enhancing adhesion between the substrate 10 and the seed layer 22. The adhesion layer 21 contains any one of titanium (Ti), titanium nitride (TiN), titanium oxide (TiO), and zinc oxide (ZnO) and is formed by sputtering ion vapor deposition, PVD, or sol-gel process.

The seed layer 22 is a layer having electrical conductivity and is a base for growing the conductive layer 23 by precipitating metal ions in a plating solution in an electrolytic plating step of forming the conductive layer 23 by electrolytic plating. A material having electrical conductivity, such as copper (Cu), titanium (Ti), and a combination of them, may be used as the material of the seed layer 22. The material of the seed layer 22 may be the same as the material of the conductive layer 23 or may be different from the material of the conductive layer 23. The thickness of the seed layer 22 is, for example, greater than or equal to 50 nm and less than or equal to 1000 nm. The seed layer 22 may be formed by using, for example, sputtering, vapor deposition, or a method combining sputtering and vapor deposition. The seed layer 22 may be formed by electroless plating, ion plating, or the like. When electroless plating is used, a catalyst, such as palladium (Pd), may be attached onto the adhesion layer 21 in advance. Thus, the seed layer 22 is easily formed on the adhesion layer 21.

The conductive layer 23 is a layer having electrical conductivity and formed on the seed layer 22 by electrolytic plating. A metal, such as copper (Cu), gold (Au), silver (Ag), platinum (Pt), rhodium (Rh), tin (Sn), aluminum (Al), nickel (Ni), and chromium (Cr), an alloy using one or some of them, or the one obtained by laminating some of them may be used as the material of the conductive layer 23.

When the thickness (t shown in FIG. 1A) of the conductive layer 23 in the through-electrode substrate 1 is less than 1 μm, electrical resistance increases, with the result that there is an inconvenience that electrical characteristics decrease. For this reason, the thickness (t shown in FIG. 1A) of the conductive layer 23 is preferably less than or equal to the hole diameter (D2 shown in FIG. 2) of the through-hole 13 at the narrowed part 14 and greater than or equal to 1 μm.

The diffusion inhibition layer 24 is a layer for inhibiting diffusion of metal, such as copper contained in the through-electrode 20A, in the substrate 10. The diffusion inhibition layer 24 contains an inorganic compound, such as silicon nitride (SiN). The thickness of the diffusion inhibition layer 24 is, for example, greater than or equal to 50 nm and less than or equal to 200 nm.

Metal, such as copper, contained in the through-electrode 20A has a larger thermal expansion coefficient than the substrate 10. Therefore, when the through-hole 13 is entirely filled with metal, such as copper, breakage, such as a crack, may occur in the through-electrode 20A or the substrate 10 due to a difference in thermal expansion coefficient. In consideration of this point, an upper limit of the volume fraction of metal, such as copper, in the through-hole 13 is preferably determined. The volume fraction of copper in the through-hole 13 is, for example, lower than or equal to 50%, may be lower than or equal to 45%, or may be lower than or equal to 40%. The volume fraction of copper in the through-hole 13 is, for example, higher than or equal to 5%, may be higher than or equal to 10%, may be higher than or equal to 20%, or may be higher than or equal to 30%.

Figure 3:
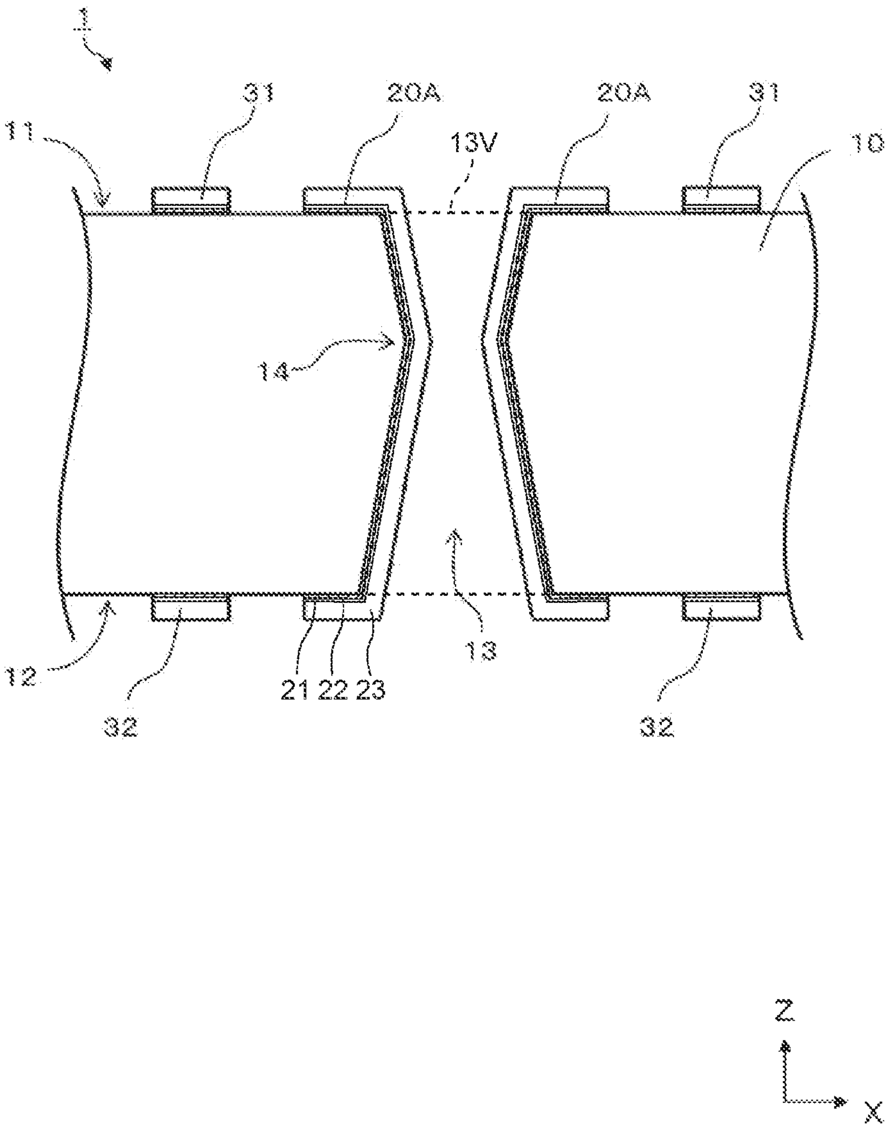
FIG. 3 is a diagram for illustrating a volume fraction of copper in a through-hole.

FIG. 3 is a diagram for illustrating the volume fraction of copper in the through-hole 13. A volume fraction is the percentage of the volume of the seed layer 22 and the conductive layer 23 in the through-hole 13 to the volume of a filling space of the through-hole 13. The volume of the filling space is the volume of a part of the through-hole 13, located on the inner side of the adhesion layer 21. In FIG. 3, the filling space is a part indicated by reference sign 13V and surrounded by the dotted line.

(Manufacturing Method for Through-Electrode Substrate)

An example of a manufacturing method for the through-electrode substrate 1 will be described. Initially, the substrate 10 is prepared. Subsequently, a through-hole forming step of forming the through-hole 13 in the substrate 10 is performed.

Figure 4:
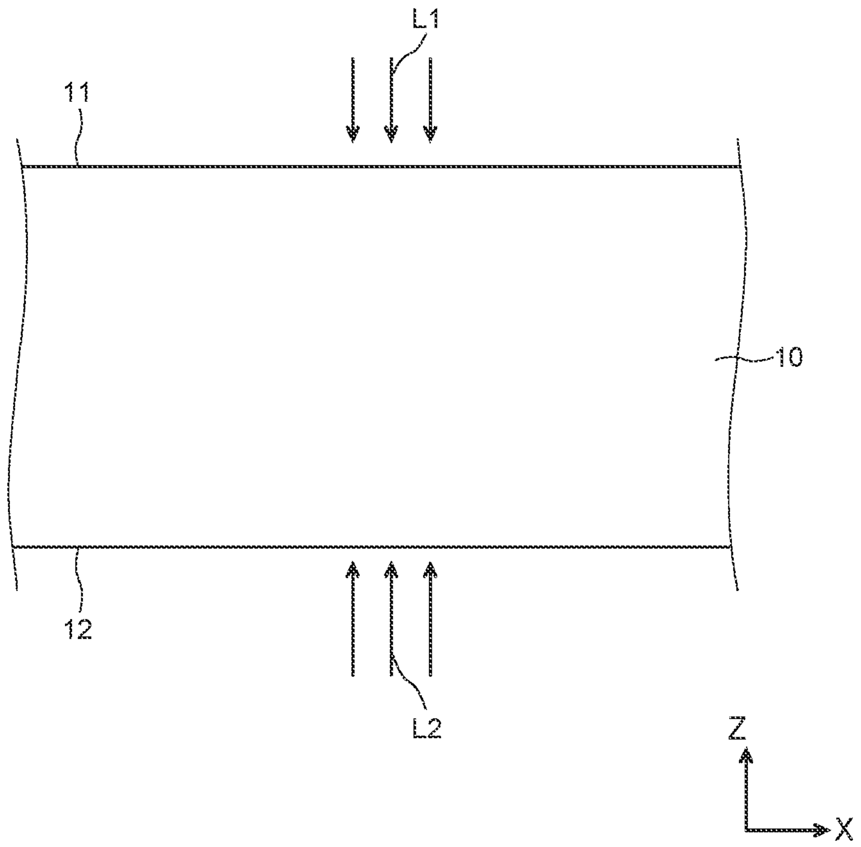
FIG. 4 is a diagram showing a step of applying laser to the substrate.

The through-hole forming step may include a process of applying laser to the substrate 10 as shown in FIG. 4. Laser is applied to an area of the substrate 10 where the through-hole 13 is formed. The area of the substrate 10, to which laser is applied, is reformed. As shown in FIG. 4, laser L1 may be applied to the first face 11, and laser L2 may be applied to the second face 12. The intensity of laser L1 may be different from the intensity of laser L2. For example, the intensity of laser L2 may be higher than the intensity of laser L1.

Figure 5:
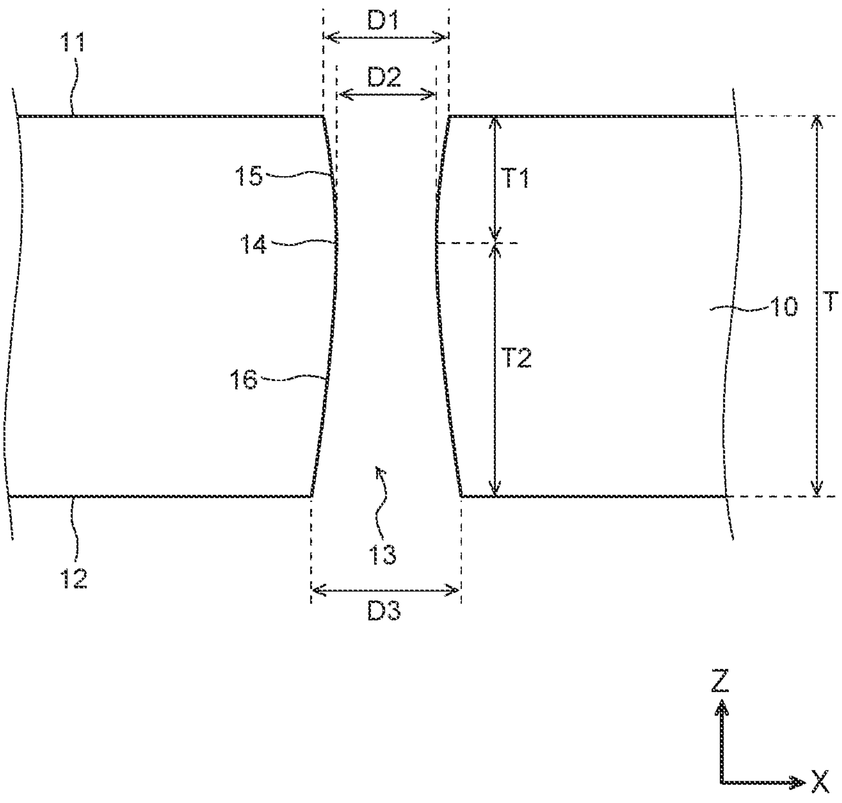
FIG. 5 is a diagram showing a step of etching the substrate.

Subsequently, in the through-hole forming step, wet etching of the substrate 10 is performed. For example, the substrate 10 is etched with an etchant, such as hydrofluoric acid. The substrate 10 is etched preferentially in the area reformed by laser. FIG. 5 is a diagram showing an example of the through-hole 13 formed in the substrate 10 by etching. The side face of the through-hole 13 formed with the above-described method can have a continuous shape with no inflection point. For example, the first tapered part 15 and the second tapered part 16 can be connected continuously at the narrowed part 14. For example, in the sectional view of the through-hole 13, a tangent at the narrowed part 14 can extend parallel to a normal direction Z of the first face 11.

Figure 6:
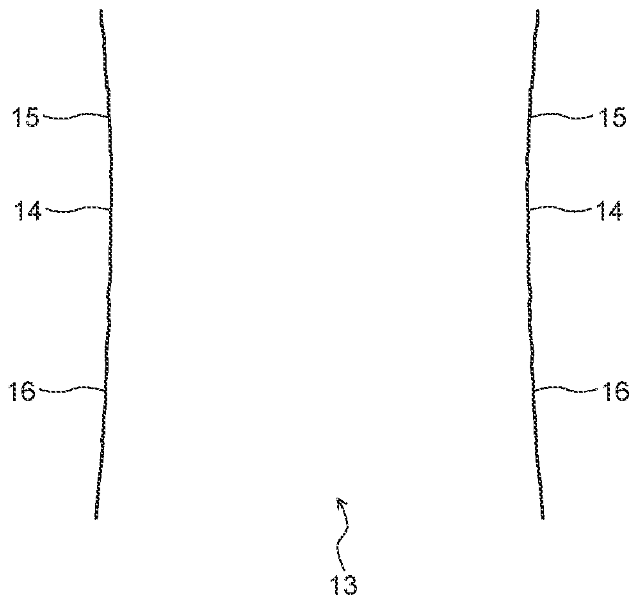
FIG. 6 is an enlarged diagram showing a side face of the through-hole.

The side face of the through-hole 13 formed with the above-described method can have a small surface roughness. FIG. 6 is an enlarged view showing the side face of the through-hole 13. The surface roughness of the side face of the through-hole 13 is, for example, less than or equal to 5 nm. Thus, the adhesion layer 21 easily uniformly adheres to the side face of the through-hole 13. The seed layer 22 easily uniformly adheres to the adhesion layer 21. When the adhesion layer 21 is not used, the seed layer 22 easily uniformly adheres to the side face of the through-hole 13. Since the surface roughness of the side face of the through-hole 13 is small, it is possible to reduce the loss of a high-frequency signal due to a skin effect. Therefore, it is possible to enhance high-frequency characteristics of the through-electrode 20A.

The surface roughness of the side face of the through-hole 13 is calculated in accordance with, for example, a sectional photograph of the through-hole 13. For example, for one through-hole 13, the heights of multiple asperities of the side face are measured in accordance with the sectional photograph. Subsequently, a mean of the heights is calculated. The mean can be used as the surface roughness of the side face of the through-hole 13.

After that, the through-electrode 20A is formed in the through-hole 13. For example, initially, the diffusion inhibition layer 24 is formed on the side face of the through-hole 13. Subsequently, the adhesion layer 21 is formed on the diffusion inhibition layer 24. Subsequently, the seed layer 22 is formed on the adhesion layer 21. Subsequently, the conductive layer 23 is formed on the seed layer 22. In this way, the through-electrode substrate 1 including the through-electrode 20A is manufactured.

Second Embodiment

Next, a through-electrode substrate 2 according to an embodiment of the through-electrode substrate according to the present disclosure will be described with reference to FIG. 7. Here, FIG. 7 is a schematic sectional view showing an example of a relevant part of the through-electrode substrate 2.

Figure 7:
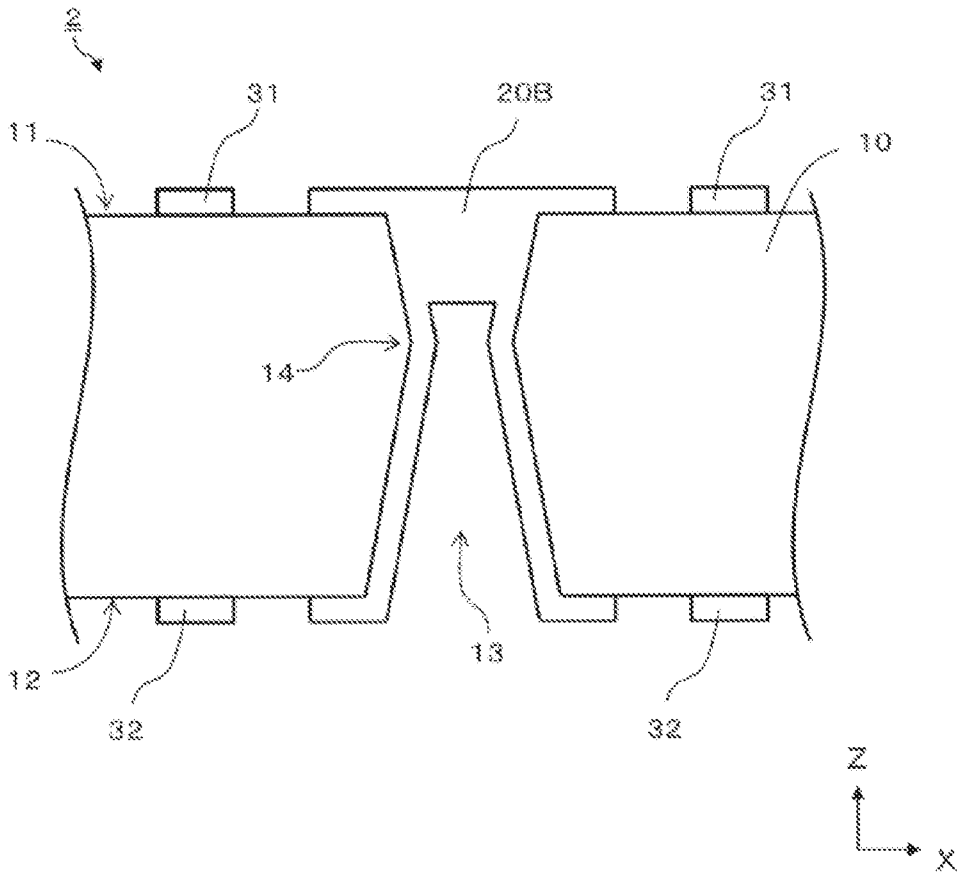
FIG. 7 is a schematic sectional view showing another example of the through-electrode substrate according to the present disclosure.

As shown in FIG. 7, the through-electrode substrate 2 includes the substrate 10 having the through-hole 13, and a through-electrode 20B located in the through-hole 13 of the substrate 10. The through-electrode substrate 2 has the first face-side wires 31 on the first face 11 side and the second face-side wires 32 on the second face 12 side.

In the above-described through-electrode substrate 1 shown in FIG. 1A, the through-electrode 20A is formed along the side face of the through-hole 13 from the first face 11 of the substrate 10 to the second face 12 of the substrate 10, and the center side of the through-hole 13 is hollow.

On the other hand, in the through-electrode substrate 2 shown in FIG. 7, the through-hole 13 is sealed with a conductive material that is a component of the through-electrode 20B at the first face 11 side of the substrate 10.

The through-electrode 20B on the second face 12 side of the substrate 10 in the through-electrode substrate 2, as in the case of the through-electrode 20A of the through-electrode substrate 1 shown in FIG. 1A, is formed along the side face of the through-hole 13, and the center side of the through-hole 13 is hollow.

Although not shown in the drawing, the through-electrode 20B of the through-electrode substrate 2, as in the case of the through-electrode 20A of the through-electrode substrate 1, is also made up of a plurality of layers. The through-electrode 20B includes the adhesion layer 21, the seed layer 22, and the conductive layer 23 in order from the side face of the through-hole 13 toward the center of the through-hole 13. The through-electrode 20B having such a form can be obtained by, for example, supplying electric power to only the seed layer 22 on the first face 11 side of the substrate 10 and then growing the conductive layer 23 on the seed layer 22 by electrolytic plating.

With the through-electrode substrate 2 shown in FIG. 7, as in the case of the through-electrode substrate 1 shown in FIG. 1A, when the dielectric loss tangent of the substrate 10 at a high frequency is set so as to fall within a predetermined range, it is possible to reduce a transmission loss at a high frequency. In the through-electrode substrate 2 as well, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

In the through-electrode substrate 2 shown in FIG. 7 as well, since the through-hole 13 has the narrowed part 14, it is possible to effectively reduce both the hole diameter of the through-hole 13 at the first face 11 side and the hole diameter of the through-hole 13 at the second face 12 side as in the case of the through-electrode substrate 1 shown in FIG. 1A.

Therefore, with the through-electrode substrate 2 as well, it is possible to further increase the number of through-electrodes per unit area, so it is possible to increase the distribution density of through-electrodes of the through-electrode substrate 2. It is also possible to further miniaturize the through-electrodes of the through-electrode substrate 2.

Furthermore, in the through-electrode substrate 2 shown in FIG. 7, connection of a terminal of a device or the like to be mounted to the through-electrode 20B at the first face 11 side of the substrate 10 of the through-electrode substrate 2 can be performed within the hole diameter of the through-hole 13 in a plan view. Therefore, further high-density implementation is possible.

In the example of the through-electrode substrate 2 shown in FIG. 7, the through-electrode 20B on the first face 11 side of the substrate 10 seals the through-hole 13 with a conductive material that is a component of the through-electrode 20B. The through-electrode 20B on the second face 12 side of the substrate 10 is formed along the side face of the through-hole 13, and the center side of the through-hole 13 is hollow. Although not shown in the drawing, the present embodiment is not limited to the example of FIG. 7.

For example, a form that is inverted upside down from the through-electrode substrate 2 shown in FIG. 7 may be used. In other words, the through-electrode 20B on the second face 12 side of the substrate 10 may seal the through-hole 13 with a conductive material that is a component of the through-electrode 20B. The through-electrode 20B on the first face 11 side of the substrate 10 may be formed along the side face of the through-hole 13, and the center side of the through-hole 13 may be hollow.

Third Embodiment

Next, a through-electrode substrate 3 according to an embodiment of the through-electrode substrate according to the present disclosure will be described with reference to FIG. 8. Here, FIG. 8 is a schematic sectional view showing an example of a relevant part of the through-electrode substrate 3.

Figure 8:
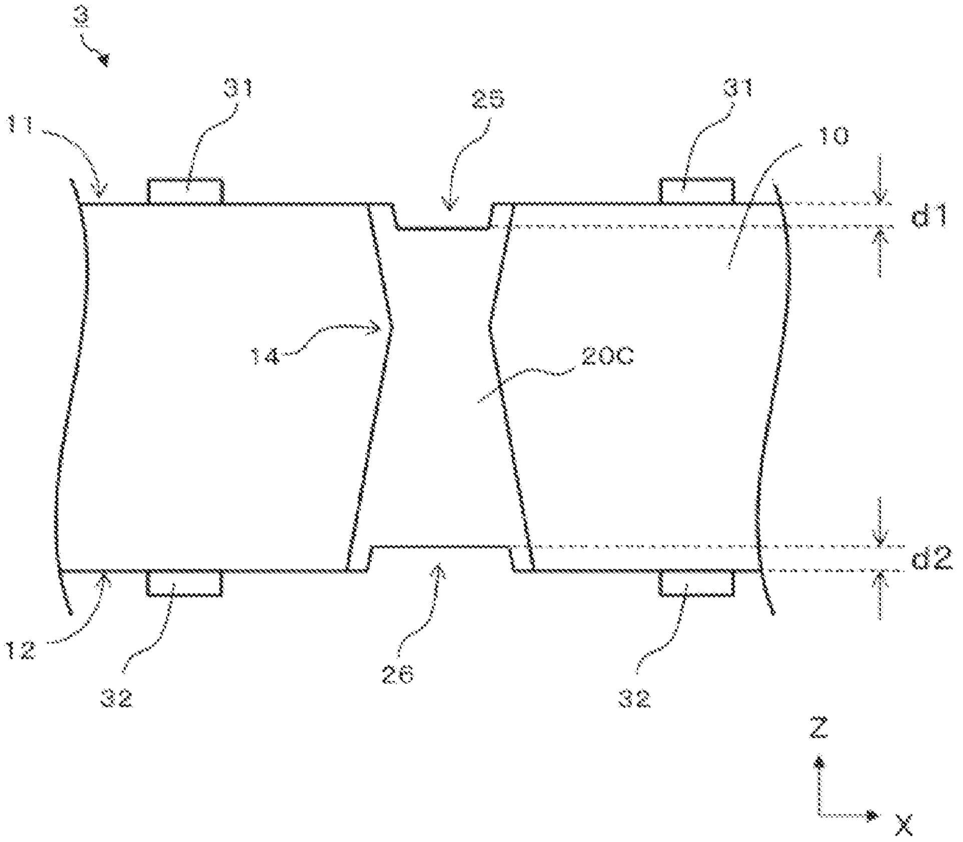
FIG. 8 is a schematic sectional view showing another example of the through-electrode substrate according to the present disclosure.

As shown in FIG. 8, the through-electrode substrate 3 includes the substrate 10 having the through-hole 13, and a through-electrode 20C located in the through-hole 13 of the substrate 10. The through-electrode substrate 3 has the first face-side wires 31 on the first face 11 side and the second face-side wires 32 on the second face 12 side.

Here, in the through-electrode substrate 1 shown in FIG. 1A, the through-electrode 20A is formed along the side face of the through-hole 13 from the first face 11 of the substrate 10 to the second face 12 of the substrate 10, and the center side of the through-hole 13 is hollow.

On the other hand, the inside of the through-hole 13 in the through-electrode substrate 3 shown in FIG. 8 is filled with a conductive material that is a component of the through-electrode 20C. In other words, the through-electrode 20C is in a mode called a filled via.

Although not shown in the drawing, the through-electrode 20C of the through-electrode substrate 3, as in the case of the through-electrode 20A of the through-electrode substrate 1, is also made up of a plurality of layers. The through-electrode 20C includes the adhesion layer 21, the seed layer 22, and the conductive layer 23 in order from the side face of the through-hole 13 toward the center of the through-hole 13. The through-electrode 20C having such a form can be obtained by, for example, supplying electric power from both the first face 11 side and second face 12 side of the substrate 10 to the seed layer 22 and then growing the conductive layer 23 by electrolytic plating.

With the through-electrode substrate 3 shown in FIG. 8, as in the case of the through-electrode substrate 1 shown in FIG. 1A, when the dielectric loss tangent of the substrate 10 at a high frequency is set so as to fall within a predetermined range, it is possible to reduce a transmission loss at a high frequency. In the through-electrode substrate 3 as well, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

In the through-electrode substrate 3 shown in FIG. 8 as well, since the through-hole 13 has the narrowed part 14, it is possible to effectively reduce both the hole diameter of the through-hole 13 at the first face 11 and the hole diameter of the through-hole 13 at the second face 12 as in the case of the through-electrode substrate 1 shown in FIG. 1A.

Therefore, with the through-electrode substrate 3 as well, it is possible to further increase the number of through-electrodes per unit area, so it is possible to increase the distribution density of through-electrodes of the through-electrode substrate 3. It is also possible to further miniaturize the through-electrodes of the through-electrode substrate 3.

Furthermore, in the through-electrode substrate 3 shown in FIG. 8, the through-electrode 20C has a filled via structure. Therefore, at both the first face 11 side and the second face 12 side of the substrate 10, connection of a terminal of a device or the like to be mounted to the through-electrode 20C can be performed within the hole diameter of the through-hole 13 in a plan view. Therefore, further high-density implementation is possible.

In the through-electrode substrate 3, a conductive material that is a component of the through-electrode 20C preferably has a recess at each of the first face 11 side and the second face 12 side of the substrate 10.

As described above, a conductive material that is a component of the through-electrode 20C is formed by electrolytic plating, and then an unnecessary conductive material formed on the first face 11 and second face 12 of the substrate 10 is removed by polishing. The conductive material is typically copper (Cu). At the time of polishing, polishing is performed such that a recess is formed on the first face 11 side and the second face 12 side of the through-electrode 20C, with the result that it is easy to completely remove a conductive material on each face in all the range of the first face 11 and the second face 12 of the substrate 10. Ordinarily, one substrate 10 has the plurality of through-electrodes 20C. When polishing is performed such that the recesses are formed as described above, it is possible to form recesses with a certain depth on the first face 11 side and the second face 12 side of each of the plurality of through-electrodes 20C. Therefore, it is possible to stably work openings of an insulating layer to be formed thereafter, so it is possible to reduce opening defects.

For example, in the through-electrode substrate 3 shown in FIG. 8, a conductive material that is a component of the through-electrode 20C has a first face-side recess 25 on the first face 11 side of the substrate 10 and has a second face-side recess 26 on the second face 12 side of the substrate 10.

The depth (d1 shown in FIG. 8) of the first face-side recess 25 from the first face 11 of the substrate 10 is preferably greater than or equal to 0.1 μm and less than or equal to 5 μm. When the depth of the first face-side recess 25 is greater than 5 μm, the film thickness of an insulating layer can be partially thick at the first face-side recess 25 at the time of forming the insulating layer on the through-electrode substrate 3 on the first face 11 side of the substrate 10. In this case, opening defects can occur when openings (vias) are provided in the insulating layer.

On the other hand, it is difficult to accurately set the depth of the first face-side recess 25 from the first face 11 of the substrate 10 to zero in terms of manufacturing technology. To provide a margin in manufacturing, the depth is preferably greater than or equal to 0.1 μm.

Similarly, the depth (d2 shown in FIG. 8) of the second face-side recess 26 from the second face 12 of the substrate 10 is preferably greater than or equal to 0.1 μm and less than or equal to 5 μm.

The above-described form can be manufactured by, for example, supplying electric power from both the first face 11 side and the second face 12 side of the substrate 10 to the seed layer 22 to grow the conductive layer 23 by electrolytic plating and then polishing the first face 11 side and the second face 12 side of the substrate 10 by chemical mechanical polishing (CMP).

The depth (d1 shown in FIG. 8) of the first face-side recess 25 and the depth (d2 shown in FIG. 8) of the second face-side recess 26 are determined from the hole diameter, the hardness of a polishing pad, and the ratio between chemical etching and mechanical etching of polishing slurry. As the hole diameter increases, the depth of the recess increases. As the polishing pad softens, the polishing pad more easily enters the hole, so the depth increases. As the chemical etching rate of the polishing slurry increases, the depth increases.

Fourth Embodiment

Next, a through-electrode substrate 4 according to an embodiment of the through-electrode substrate according to the present disclosure will be described with reference to FIG. 9. Here, FIG. 9 is a schematic sectional view showing an example of a relevant part of the through-electrode substrate 4.

Figure 9:
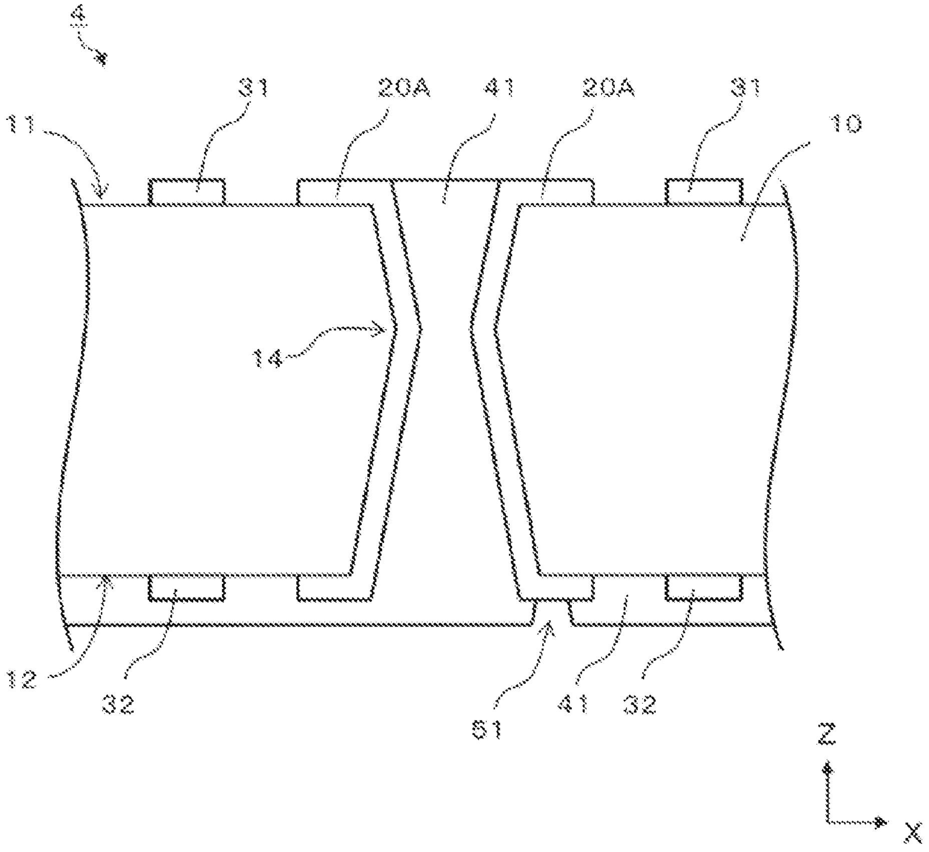
FIG. 9 is a schematic sectional view showing another example of the through-electrode substrate according to the present disclosure.

As shown in FIG. 9, the through-electrode substrate 4 includes the substrate 10 having the through-hole 13, and the through-electrode 20A located in the through-hole 13 of the substrate 10. The through-electrode substrate 4 has the first face-side wires 31 on the first face 11 side and the second face-side wires 32 on the second face 12 side.

Here, in the through-electrode substrate 1 shown in FIG. 1A, the center side of the through-hole 13 is hollow. On the other hand, in the through-electrode substrate 4 shown in FIG. 9, the inside of the through-hole 13 is filled with a resin material 41. In other words, the through-electrode substrate 4 shown in FIG. 9 has the configuration of the through-electrode substrate 1 shown in FIG. 1A, and, furthermore, the inside of the through-hole 13 is filled with the resin material 41. Although not shown in the drawing, the through-electrode 20A of the through-electrode substrate 4, as in the case of the through-electrode 20A of the through-electrode substrate 1, is also made up of a plurality of layers. The through-electrode 20A includes the adhesion layer 21, the seed layer 22, and the conductive layer 23 in order from the side face of the through-hole 13 toward the center of the through-hole 13.

To fill the inside of the through-hole 13 with the resin material 41 as in the case of the through-electrode substrate 4 shown in FIG. 9, for example, a method of sticking a film made of the resin material 41 to each of the first face 11 side and the second face 12 side of the substrate and burying the through-hole with a method, such as vacuum laminate, can be used.

A redundant film part on each of the first face 11 side and the second face 12 side of the substrate can be removed by, for example, scraping using a squeegee. A redundant film part can also be removed by applying a descum process using oxygen gas.

In this way, it is possible to obtain the through-electrode substrate 4 shown in FIG. 9.

With the through-electrode substrate 4 shown in FIG. 9, as in the case of the through-electrode substrate 1 shown in FIG. 1A, when the dielectric loss tangent of the substrate 10 at a high frequency is set so as to fall within a predetermined range, it is possible to reduce a transmission loss at a high frequency. In the through-electrode substrate 4 as well, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

In the through-electrode substrate 4 shown in FIG. 9 as well, since the through-hole 13 has the narrowed part 14, it is possible to effectively reduce both the hole diameter of the through-hole 13 at the first face 11 side and the hole diameter of the through-hole 13 at the second face 12 side as in the case of the through-electrode substrate 1 shown in FIG. 1A.

Therefore, with the through-electrode substrate 4 as well, it is possible to further increase the number of through-electrodes per unit area, so it is possible to increase the distribution density of through-electrodes of the through-electrode substrate 4. It is also possible to further miniaturize the through-electrodes of the through-electrode substrate 4.

In the through-electrode substrate 4 shown in FIG. 9, the dielectric loss tangent at a high frequency of the resin material 41 that fills the through-hole 13 is preferably a small value in a predetermined range. Thus, in comparison with a through-electrode substrate of which the through-hole is filled with a resin of which the dielectric loss tangent is a larger value, it is possible to reduce a transmission loss of the through-electrode substrate 4 at a high frequency. In the through-electrode substrate 4, the dielectric loss tangent of the resin material 41 at a frequency of 20 GHz is, for example, less than or equal to 0.02 or may be less than or equal to 0.01. The dielectric loss tangent of the resin material 41 at a frequency of 20 GHz may be greater than or equal to 0.003.

The thermal expansion coefficient of the resin material 41 is, for example, larger than or equal to 17 ppm and smaller than or equal to 70 ppm.

A transmission loss of the through-electrode 20A of the through-electrode substrate 4 depends on the dielectric loss tangent at a high frequency of the resin material 41 filling the through-hole 13. As the dielectric loss tangent of the resin material 41 reduces, a transmission loss reduces. The resin material 41 needs fillability (for example, no voids) in the through-hole at the same time, and a component, such as a filler, is added for viscoelasticity control. For this reason, as a result, the dielectric loss tangent of the resin material 41 at a frequency of 20 GHz is greater than or equal to 0.003. The content of filler in the resin material 41 is, for example, higher than or equal to 30 vol % and lower than or equal to 80 vol %.

Examples of the resin material 41 include polyimide, epoxy, benzocyclobutene resin, polyamide, phenolic resin, silicone resin, fluororesin, liquid crystal polymer, polyamide-imide, polybenzoxazole, cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyallylate, and polyether-imide. The resins may be used solely or two or more types of resins may be used in combination. The resins may be used together with an inorganic filler, such as glass, talc, mica, silica, and alumina, or the like.

The resin material 41 may contain Chemical Compound 1 including the structure expressed by the following chemical formula (1).

[Chemical Formula 1]

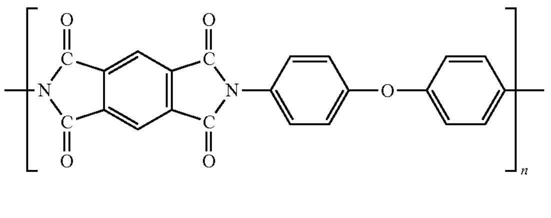

The resin material 41 may contain Chemical Compound 2 including the structure expressed by the following chemical formula (2).

[Chemical Formula 2]

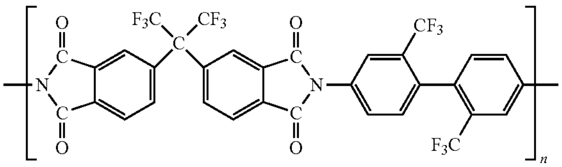

The resin material 41 may contain Chemical Compound 3 including the structure expressed by the following chemical formula (3).

The through-electrode 20D at the second face 12 side of the substrate 10 in the through-electrode substrate 5, as in the case of the through-electrode 20B of the through-electrode substrate 2 shown in FIG. 7, is formed along the side face of the through-hole 13, and the center side of the through-hole 13 is hollow.

Although not shown in the drawing, the through-electrode 20D of the through-electrode substrate 5, as in the case of the through-electrode 20B of the through-electrode substrate 2, is also made up of a plurality of layers. The through-electrode 20D includes the adhesion layer 21, the seed layer 22, and the conductive layer 23 in order from the side face of the through-hole 13 toward the center of the through-hole 13.

[Chemical Formula 3]

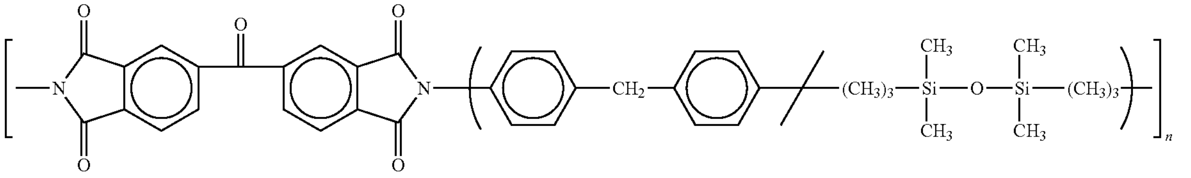

The resin material 41 may contain Chemical Compound 1, Chemical Compound 2, and Chemical Compound 3 at a predetermined ratio. For example, the resin material 41 may be polyimide containing Chemical Compound 1, Chemical Compound 2, and Chemical Compound 3 at a weight ratio of 40:30:30.

In the present embodiment, a resin layer made of the resin material 41 may be formed on at least one of the first face 11 side of the substrate 10 and the second face 12 side of the substrate 10 to be used as an insulating layer. For example, in the through-electrode substrate 4 shown in FIG. 9, the resin layer made of the resin material 41 is formed on the second face 12 side of the substrate 10. Then, when the dielectric loss tangent of the resin material 41 at a high frequency is set so as to fall within a predetermined range, it is possible to further reduce a transmission loss of the through-electrode substrate 4 at a high frequency.

Here, the resin layer preferably has an opening at a position that overlaps the through-electrode in a plan view. When Gas is generated at the interface between the through-electrode and the substrate, the gas can be released.

For example, the through-electrode substrate 4 shown in FIG. 9 has an opening 51 at a position that overlaps the through-electrode 20A in a plan view.

Fifth Embodiment

Next, a through-electrode substrate 5 according to an embodiment of the through-electrode substrate according to the present disclosure will be described with reference to FIG. 10. Here, FIG. 10 is a schematic sectional view showing an example of a relevant part of the through-electrode substrate 5.

Figure 10:
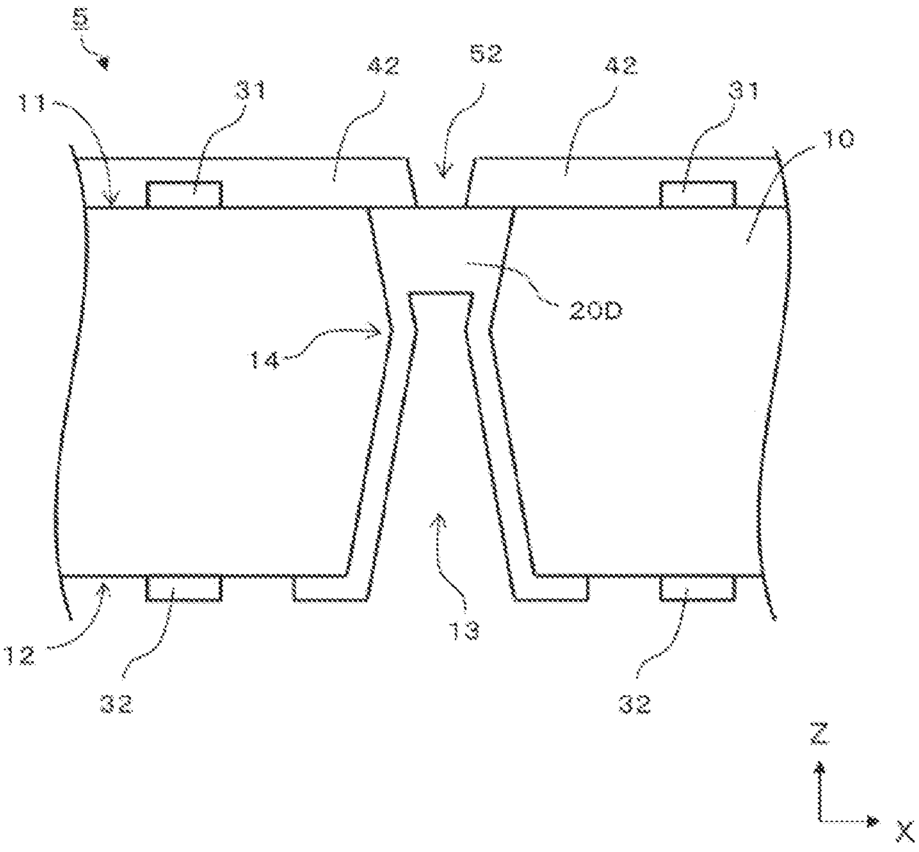
FIG. 10 is a schematic sectional view showing another example of the through-electrode substrate according to the present disclosure.

As shown in FIG. 10, the through-electrode substrate 5 includes the substrate 10 having the through-hole 13, and a through-electrode 20D located in the through-hole 13 of the substrate 10. The through-electrode substrate 5 has the first face-side wires 31 on the first face 11 side and the second face-side wires 32 on the second face 12 side.

In the through-electrode substrate 5 shown in FIG. 10, the through-hole 13 is sealed with a conductive material that is a component of the through-electrode 20D at the first face 11 side of the substrate 10.

With the through-electrode substrate 5 shown in FIG. 10, as in the case of the through-electrode substrate 2 shown in FIG. 7, when the dielectric loss tangent of the substrate 10 at a high frequency is set so as to fall within a predetermined range, it is possible to reduce a transmission loss at a high frequency. In the through-electrode substrate 5 as well, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

In the through-electrode substrate 5 shown in FIG. 10 as well, since the through-hole 13 has the narrowed part 14, it is possible to effectively reduce both the hole diameter of the through-hole 13 at the first face 11 and the hole diameter of the through-hole 13 at the second face 12 as in the case of the through-electrode substrate 2 shown in FIG. 7.

Therefore, with the through-electrode substrate 5 as well, it is possible to further increase the number of through-electrodes per unit area, so it is possible to increase the distribution density of through-electrodes of the through-electrode substrate 5. It is also possible to further miniaturize the through-electrodes of the through-electrode substrate 5.

In the through-electrode substrate 5 shown in FIG. 10, connection of a terminal of a device or the like to be mounted to the through-electrode 20D at the first face 11 side of the substrate 10 of the through-electrode substrate 5 can be performed within the hole diameter of the through-hole 13 in a plan view, so further high-density implementation is possible.

The through-electrode substrate 5 shown in FIG. 10 has an insulating resin layer 42 on the first face 11 side of the substrate 10. The dielectric loss tangent of the insulating resin layer 42 at a high frequency is preferably a small value in a predetermined range. Thus, in comparison with a through-electrode substrate using a resin of which the dielectric loss tangent is a larger value, for an insulating layer, it is possible to reduce a transmission loss of the through-electrode substrate 5 at a high frequency.

In the through-electrode substrate 5, the dielectric loss tangent of the insulating resin layer 42 at a frequency of 20 GHz is preferably greater than or equal to 0.001 and less than or equal to 0.01.

In the mode like the through-electrode substrate 5, when transmission lines are formed on the insulating resin layer 42, a transmission loss reduces as the dielectric loss tangent of the insulating resin layer 42 reduces. For this reason, the dielectric loss tangent of the insulating resin layer 42 at a frequency of 20 GHz is preferably less than or equal to 0.01. The dielectric loss tangent of the insulating resin layer 42 at a frequency of 20 GHz may be less than 0.003. On the other hand, if the dielectric loss tangent of the insulating resin layer 42 at a frequency of 20 GHz is less than 0.001, wire adhesion of the insulating layer may be impaired. For this reason, the dielectric loss tangent of the insulating resin layer 42 at a frequency of 20 GHz is preferably greater than or equal to 0.001. The dielectric loss tangent of the insulating resin layer 42 at a frequency of 20 GHz may be greater than or equal to 0.0017.

The thermal expansion coefficient of the insulating resin layer 42 is, for example, larger than or equal to 30 ppm and smaller than or equal to 100 ppm.

Examples of the resin that is a component of the insulating resin layer 42 may include epoxy resins, polyphenylene ether resins, and fluororesins, such as polytetrafluoroethylene resin. Specific examples of the epoxy resins may include GY11 and GL102 made by Ajinomoto Fine-Techno Co., Inc. and Zaristo517X made by Taiyo Ink Mfg. Co., Ltd. Specific examples of the polyphenylene ether resins include NC0209 made by Namics Corporation. Specific examples of the fluororesins include Cytop and EPRIMA L made by AGC inc.

The resin that is a component of the insulating resin layer 42 may be the same as that of the resin material 41.

The insulating resin layer 42 may contain Chemical Compound 1 including the structure expressed by the above-described chemical formula (1).

The insulating resin layer 42 may contain Chemical Compound 2 including the structure expressed by the above-described chemical formula (2).

The insulating resin layer 42 may contain Chemical Compound 3 including the structure expressed by the above-described chemical formula (3).

The insulating resin layer 42 may contain Chemical Compound 1, Chemical Compound 2, and Chemical Compound 3 at a predetermined ratio. For example, the resin material 41 may be polyimide containing Chemical Compound 1, Chemical Compound 2, and Chemical Compound 3 at a weight ratio of 10:60:30.

The insulating resin layer 42 preferably has an opening at a position that overlaps the through-electrode in a plan view. When Gas is generated at the interface between the through-electrode and the substrate, the gas can be released.

For example, the through-electrode substrate 5 shown in FIG. 10 has an opening 52 at a position that overlaps the through-electrode 20D in a plan view.

Sixth Embodiment

Next, a through-electrode substrate 6 according to an embodiment of the through-electrode substrate according to the present disclosure will be described with reference to FIG. 11. Here, FIG. 11 is a schematic sectional view showing an example of a relevant part of the through-electrode substrate 6.

Figure 11:
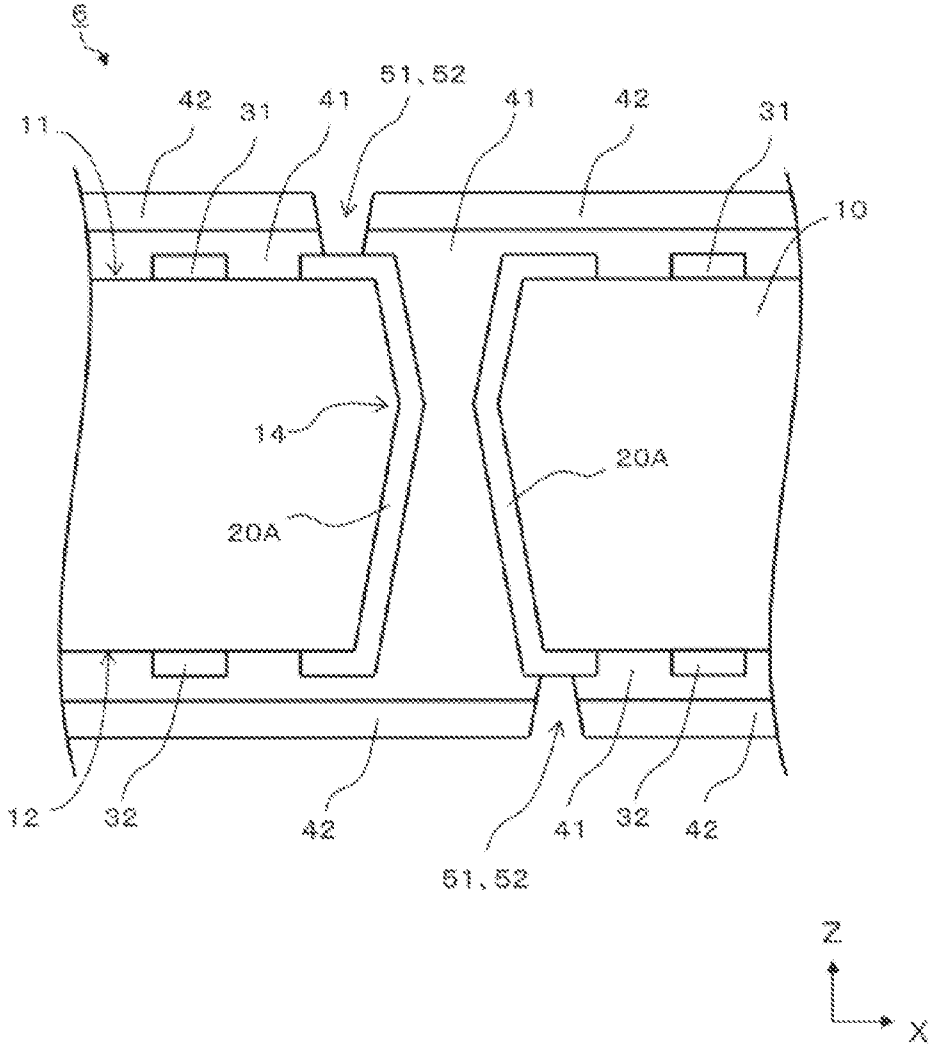
FIG. 11 is a schematic sectional view showing another example of the through-electrode substrate according to the present disclosure.

As shown in FIG. 11, the through-electrode substrate 6 includes the substrate 10 having the through-hole 13, and the through-electrode 20A located in the through-hole 13 of the substrate 10. The through-electrode substrate 6 has the first face-side wires 31 on the first face 11 side and the second face-side wires 32 on the second face 12 side.

Here, in the through-electrode substrate 1 shown in FIG. 1A, the center side of the through-hole 13 is hollow. On the other hand, in the through-electrode substrate 6 shown in FIG. 11, the inside of the through-hole 13 is filled with a resin material 41. In other words, the through-electrode substrate 6 shown in FIG. 11 has the configuration of the through-electrode substrate 1 shown in FIG. 1A, and, furthermore, the inside of the through-hole 13 is filled with the resin material 41. Although not shown in the drawing, the through-electrode 20A of the through-electrode substrate 6, as in the case of the through-electrode 20A of the through-electrode substrate 1, is also made up of a plurality of layers. The through-electrode 20A includes the adhesion layer 21, the seed layer 22, and the conductive layer 23 in order from the side face of the through-hole 13 toward the center of the through-hole 13.

For example, in the through-electrode substrate 6 shown in FIG. 11, the resin layer made of the resin material 41 is formed on both the first face 11 side and the second face 12 side of the substrate 10. Furthermore, on both the first face 11 side and the second face 12 side of the substrate 10, the insulating resin layer 42 is formed on the resin layer made of the resin material 41.

Then, the resin layer made of the resin material 41 has the opening 51 at a position that overlaps the through-electrode 20A in a plan view, and the insulating resin layer 42 has the opening 52 at a position that overlaps the opening 51 in a plan view.

With the through-electrode substrate 6 shown in FIG. 11, as in the case of the through-electrode substrate 1 shown in FIG. 1A, when the dielectric loss tangent of the substrate 10 at a high frequency is set so as to fall within a predetermined range, it is possible to reduce a transmission loss at a high frequency. In the through-electrode substrate 6 as well, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

In the through-electrode substrate 6 shown in FIG. 11 as well, since the through-hole 13 has the narrowed part 14, it is possible to effectively reduce both the hole diameter of the through-hole 13 at the first face 11 side and the hole diameter of the through-hole 13 at the second face 12 side as in the case of the through-electrode substrate 1 shown in FIG. 1A.

Therefore, with the through-electrode substrate 6 as well, it is possible to further increase the number of through-electrodes per unit area, so it is possible to increase the distribution density of through-electrodes of the through-electrode substrate 6. It is also possible to further miniaturize the through-electrodes of the through-electrode substrate 6.

In the through-electrode substrate 6 shown in FIG. 11, as in the case of the through-electrode substrate 4 shown in FIG. 9, the dielectric loss tangent at a high frequency of the resin material 41 that fills the through-hole 13 preferably falls within a predetermined range. Thus, it is possible to further reduce a transmission loss of the through-electrode substrate 4 at a high frequency. In the through-electrode substrate 6 as well, the dielectric loss tangent of the resin material 41 at a frequency of 20 GHz is, for example, less than or equal to 0.02 or may be less than or equal to 0.01. The dielectric loss tangent of the resin material 41 at a frequency of 20 GHz may be greater than or equal to 0.003.

For example, in the through-electrode substrate 6 shown in FIG. 11, the resin layer made of the resin material 41 is formed on both the first face 11 side and the second face 12 side of the substrate 10. Therefore, when the dielectric loss tangent of the resin material 41 at a high frequency is set so as to fall within a predetermined range, it is possible to further reduce a transmission loss of the through-electrode substrate 6 at a high frequency.

Furthermore, in the through-electrode substrate 6 shown in FIG. 11, on both the first face 11 side and the second face 12 side of the substrate 10, the insulating resin layer 42 is formed on the resin layer made of the resin material 41. Therefore, when the dielectric loss tangent at a high frequency of the resin that is a component of the insulating resin layer 42 is set so as to fall within a predetermined range, it is possible to further reduce a transmission loss of the through-electrode substrate 6 at a high frequency.

In the through-electrode substrate 6 as well, the dielectric loss tangent of the resin that is a component of the insulating resin layer 42 at a frequency of 20 GHz is preferably greater than or equal to 0.001 and less than or equal to 0.01. The dielectric loss tangent of the resin that is a component of the insulating resin layer 42 at a frequency of 20 GHz may be greater than or equal to 0.0017 and less than 0.003.

The insulating resin layer 42 on the first face 11 side is also referred to as first insulating resin layer 42. The insulating resin layer 42 on the second face 12 side is also referred to as second insulating resin layer 42. A value obtained by multiplying the thermal expansion coefficient, elastic modulus, and thickness of the first insulating resin layer 42 is also referred to as first parameter P1. A value obtained by multiplying the thermal expansion coefficient, elastic modulus, and thickness of the second insulating resin layer 42 is also referred to as second parameter P2. The thickness of the first insulating resin layer 42 and the thickness of the second insulating resin layer 42 are measured at a part of the first insulating resin layer 42, which does not overlap the wires or the conductive layer. A difference between the first parameter P1 and the second parameter P2 is preferably small. For example, P2 is preferably greater than or equal to 0.8×P1 and less than or equal to 1.2×P1. Thus, it is possible to reduce a difference between a stress that occurs in the first insulating resin layer 42 and a stress that occurs in the second insulating resin layer 42.

The resin layer made of the resin material 41 has the opening 51 at a position that overlaps the through-electrode 20A in a plan view, and the insulating resin layer 42 has the opening 52 at a position that overlaps the opening 51 in a plan view.

Therefore, even when gas is generated at the interface between the through-electrode and the substrate, the gas can be effectively released.

Although not shown in the drawing, the resin layer made of the resin material 41 and the insulating resin layer 42 may be provided only on one of the first face 11 and the second face 12. In this case, a mean of the thermal expansion coefficient of the resin layer made of the resin material 41 and the thermal expansion coefficient of the insulating resin layer 42 is preferably larger than or equal to 40 ppm and smaller than or equal to 60 ppm.

Seventh Embodiment

Next, a through-electrode substrate 7 according to an embodiment of the through-electrode substrate according to the present disclosure will be described with reference to FIG. 12. Here, FIG. 12 is a schematic sectional view showing an example of a relevant part of the through-electrode substrate 7.

Figure 12:
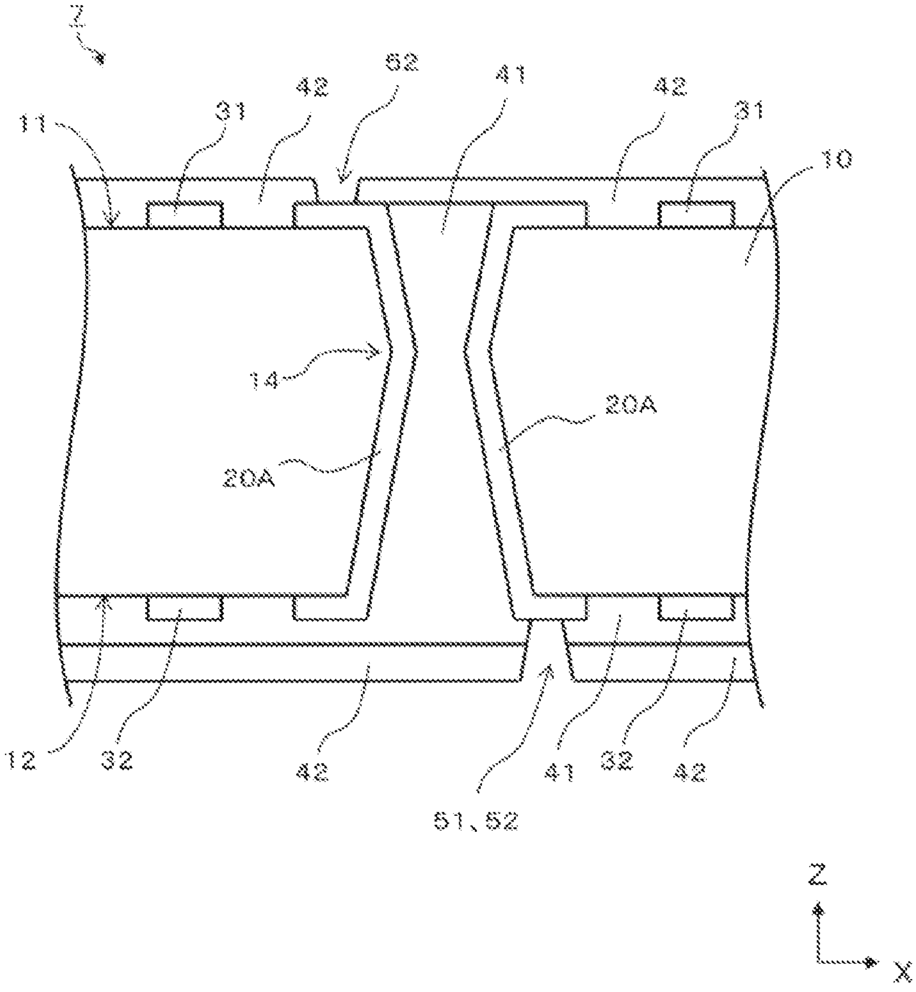
FIG. 12 is a schematic sectional view showing another example of the through-electrode substrate according to the present disclosure.

As shown in FIG. 12, the through-electrode substrate 7 includes the substrate 10 having the through-hole 13, and the through-electrode 20A located in the through-hole 13 of the substrate 10. The through-electrode substrate 7 has the first face-side wires 31 on the first face 11 side and the second face-side wires 32 on the second face 12 side.

Here, in the through-electrode substrate 1 shown in FIG. 1A, the center side of the through-hole 13 is hollow. On the other hand, in the through-electrode substrate 7 shown in FIG. 12, the inside of the through-hole 13 is filled with a resin material 41. In other words, the through-electrode substrate 7 shown in FIG. 12 has the configuration of the through-electrode substrate 1 shown in FIG. 1A, and, furthermore, the inside of the through-hole 13 is filled with the resin material 41. Although not shown in the drawing, the through-electrode 20A of the through-electrode substrate 7, as in the case of the through-electrode 20A of the through-electrode substrate 1, is also made up of a plurality of layers. The through-electrode 20A includes the adhesion layer 21, the seed layer 22, and the conductive layer 23 in order from the side face of the through-hole 13 toward the center of the through-hole 13.

In the through-electrode substrate 7 shown in FIG. 12, the resin layer made of the resin material 41 is formed on the second face 12 side of the substrate 10. Furthermore, the insulating resin layer 42 is formed on both the first face 11 side and the second face 12 side of the substrate 10. On the second face 12 side of the substrate 10, the insulating resin layer 42 is formed on the resin layer made of the resin material 41.

Then, the resin layer made of the resin material 41 has the opening 51 at a position that overlaps the through-electrode 20A in a plan view, and the insulating resin layer 42 also has the opening 52 at a position that overlaps the through-electrode 20A in a plan view. On the second face 12 side of the substrate 10, the opening 52 of the insulating resin layer 42 is formed at a position that overlaps the opening 51 of the resin layer made of the resin material 41 in a plan view.

With the through-electrode substrate 7 shown in FIG. 12, as in the case of the through-electrode substrate 1 shown in FIG. 1A, when the dielectric loss tangent of the substrate 10 at a high frequency is set so as to fall within a predetermined range, it is possible to reduce a transmission loss at a high frequency. In the through-electrode substrate 7 as well, the dielectric loss tangent of the substrate 10 at a frequency of 20 GHz is preferably less than or equal to 0.0005. The dielectric loss tangent of the substrate 10 at a frequency of 20 GHz may be greater than or equal to 0.0002 or may be greater than or equal to 0.0003.

In the through-electrode substrate 7 shown in FIG. 12 as well, since the through-hole 13 has the narrowed part 14, it is possible to effectively reduce both the hole diameter of the through-hole 13 at the first face 11 side and the hole diameter of the through-hole 13 at the second face 12 side as in the case of the through-electrode substrate 1 shown in FIG. 1A.

Therefore, with the through-electrode substrate 7 as well, it is possible to further increase the number of through-electrodes per unit area, so it is possible to increase the distribution density of through-electrodes of the through-electrode substrate 7. It is also possible to further miniaturize the through-electrodes of the through-electrode substrate 7.

In the through-electrode substrate 7 shown in FIG. 12, as in the case of the through-electrode substrate 4 shown in FIG. 9, a transmission loss of the through-electrode substrate 7 at a high frequency can be further reduced in a manner such that the dielectric loss tangent at a high frequency of the resin material 41 filling the through-hole 13 is set within a predetermined range. In the through-electrode substrate 7 as well, the dielectric loss tangent of the resin material 41 at a frequency of 20 GHz is, for example, less than or equal to 0.02 or may be less than or equal to 0.01. The dielectric loss tangent of the resin material 41 at a frequency of 20 GHz may be greater than or equal to 0.003.

In the through-electrode substrate 7 shown in FIG. 12, the resin layer made of the resin material 41 is formed on the second face 12 side of the substrate 10. Therefore, when the dielectric loss tangent of the resin material 41 at a high frequency is set so as to fall within a predetermined range, it is possible to further reduce a transmission loss of the through-electrode substrate 7 at a high frequency.

Furthermore, in the through-electrode substrate 7 shown in FIG. 12, the insulating resin layer 42 is formed on both the first face 11 side and the second face 12 side of the substrate 10. Therefore, when the dielectric loss tangent at a high frequency of the resin that is a component of the insulating resin layer 42 is set so as to fall within a predetermined range, it is possible to further reduce a transmission loss of the through-electrode substrate 7 at a high frequency.

In the through-electrode substrate 7 as well, the dielectric loss tangent of the resin that is a component of the insulating resin layer 42 at a frequency of 20 GHz is preferably greater than or equal to 0.001 and less than or equal to 0.01. The dielectric loss tangent of the resin that is a component of the insulating resin layer 42 at a frequency of 20 GHz may be greater than or equal to 0.0017 and less than 0.003.

In the through-electrode substrate 7 shown in FIG. 12 as well, the resin layer made of the resin material 41 has the opening 51 at a position that overlaps the through-electrode 20A in a plan view, and the insulating resin layer 42 has the opening 52 at a position that overlaps the opening 51 in a plan view.

Therefore, even when gas is generated at the interface between the through-electrode and the substrate, the gas can be effectively released.

EXAMPLES

Hereinafter, the embodiment of the present disclosure will be specifically described in detail by examples and comparative examples. However, the embodiment of the present disclosure is not limited to the examples.

Example 1

A substrate A with a thickness of 400 μm was prepared as a substrate of Example 1. The substrate A was mainly made of quartz. The dielectric loss tangent of the substrate A at a frequency of 20 GHz was measured by a cavity resonance method and was 0.0005.

Subsequently, a pulse of femtosecond laser was applied to the substrate A to reform the material of an area to be a through-hole, and then the substrate A was etched by using hydrofluoric acid to obtain a substrate having a predetermined through-hole with a narrowed part as shown in FIG. 2. The hole diameter of the through-hole at the first face of the substrate A was 60 μm, the hole diameter of the through-hole at the second face was 60 μm, and the hole diameter of the through-hole at the narrowed part was 10 μm.

Here, dimensions were measured as follows. Initially, a cross section as shown in FIG. 2 was obtained for each substrate with an ion milling machine (IM-4000 made by Hitachi Hich-Tech Corporation). For the obtained cross section, the diameter of the through-hole was measured with a length measuring optical microscope (STM-6-LM made by Olympus Corporation) and compared with the diameter of the through-hole in a plan view before the cross section was obtained. Thus, it was ensured that the cross section passed within ±5% from the opening center of the through-hole.

The hole diameters (D1, D2, D3) shown in FIG. 2 were obtained by measuring the cross sections with the length measuring optical microscope (STM-6-LM made by Olympus Corporation).

Subsequently, an adhesion layer made of zinc oxide (ZnO) was formed in the through-hole by sol-gel process, the adhesion layer was caused to adsorb palladium (Pd), and a seed layer made of copper (Cu) was formed on the adhesion layer by electroless copper (Cu) plating. The thickness of the seed layer formed was 0.4 μm.

Subsequently, a dry film resist NIT915 was laminated on both the first face and second face of the substrate, and a resist pattern for forming a through-electrode and wires as shown in FIG. 1A was formed by using a photomask.

Subsequently, a through-electrode and wires were formed by electrolytic plating, the resist pattern was peeled off, and then an unnecessary seed layer was removed by etching. Thus, the through-electrode substrate of Example 1 in a form as shown in FIG. 1A was obtained. The wire (transmission line) had a wire length of 10 mm and was connected from the first face side of the substrate to the second face side of the substrate via the through-electrode.

For the obtained through-electrode substrate, an ACP probe was attached to a GSG coplanar transmission line with a two-port method, and an S21 insertion loss was measured in a frequency range of 0.1 GHz to 40 GHz with a network analyzer. A transmission loss at a frequency of 20 GHz was −1.31 dB.

Example 2

A substrate B with a thickness of 400 μm was prepared as a substrate of Example 2. The substrate B was also mainly made of quartz. The dielectric loss tangent of the substrate B at a frequency of 20 GHz was measured by a cavity resonance method and was 0.0004.

After that, the substrate B was worked as in the case of Example 1 to obtain a through-electrode substrate of Example 2. A transmission loss of the through-electrode substrate of Example 2 was obtained as in the case of Example 1 and was −1.25 dB at a frequency of 20 GHz.

Example 3

The same substrate A as that of Example 1 was prepared as a substrate of Example 3.

Subsequently, the substrate A was worked as in the case of Example 1 to form a through-hole, an adhesion layer, and a seed layer.

Subsequently, electrolytic plating was performed by passing current between the first face side of the substrate and an anode to obtain a form in which the first face side of the substrate was sealed with copper (Cu) like the through-electrode 20B shown in FIG. 7.

Subsequently, copper (Cu) on the first face side and the second face side of the substrate was removed by CMP, and wires were formed by using a dry film resist and a photomask, to obtain a through-electrode substrate of Example 3 that is a form as shown in FIG. 7.

A transmission loss of the through-electrode substrate of Example 3 was obtained as in the case of Example 1 and was −1.26 dB at a frequency of 20 GHz.

Example 4

The same substrate A as that of Example 1 was prepared as a substrate of Example 4.

Subsequently, the substrate A was worked as in the case of Example 1 to form a through-hole, an adhesion layer, and a seed layer.

Subsequently, electrolytic plating was performed, and copper (Cu) on the first face side and the second face side of the substrate was removed by CMP, to obtain a form in which the inside of the through-hole was filled with copper (Cu) as in the case of the through-electrode 20C shown in FIG. 8. In the through-electrode substrate of Example 4, a first face-side recess was provided at the first face side of the through-electrode, a second face-side recess was provided at the second face side, and the depth of each recess was 5 μm.

Subsequently, a seed layer was formed on the first face side and the second face side of the substrate, and wires were formed by using a dry film resist and a photomask, to obtain a through-electrode substrate of Example 4.

A transmission loss of the through-electrode substrate of Example 4 was obtained as in the case of Example 1 and was −1.22 dB at a frequency of 20 GHz.

Example 5

The same substrate A as that of Example 1 was prepared as a substrate of Example 5.

After that, the substrate A was worked to form a through-electrode substrate of Example 5 as in the case of Example 4. Here, in the through-electrode substrate of Example 5, a first face-side recess was provided at the first face side of the through-electrode, a second face-side recess was provided at the second face side, and the depth of each recess was 4 μm.

A transmission loss of the through-electrode substrate of Example 5 was obtained as in the case of Example 1 and was −1.22 dB at a frequency of 20 GHz.

Comparative Example 1

The same substrate A as that of Example 1 was prepared as a substrate of Comparative Example 1.

Subsequently, the substrate A was worked as in the case of Example 1 to form a through-hole, an adhesion layer, and a seed layer.

Subsequently, electrolytic plating was performed, and copper (Cu) on the first face side and the second face side of the substrate was removed by CMP, to obtain a form in which the inside of the through-hole was filled with copper (Cu) as in the case of the through-electrode 20C shown in FIG. 8. In the through-electrode substrate of Comparative Example 1, a first face-side recess was provided at the first face side of the through-electrode, a second face-side recess was provided at the second face side, and the depth of each recess was 6 μm.

The depth of each recess was determined in accordance with CMP conditions; however, Comparative Example 1 was implemented in a pattern with a large film thickness distribution of electrolytic plating, so a CMP time was 1.2 times as long as that of Example 4 to deal with the distribution. Therefore, the depth of each recess was 6 μm.

Subsequently, as in the case of Example 4, a seed layer was formed on the first face side and the second face side of the substrate, and wires were intended to be formed with a dry film resist and a photomask; however, the dry film resist was defective in opening.

Example 6

The substrate A as in the case of Example 1 was prepared as a substrate of Example 6, and the substrate A was worked as in the case of Example 1 to form a through-hole, an adhesion layer, and a seed layer.

Subsequently, a dry film resist NIT915 was laminated on both the first face and second face of the substrate, a through-electrode and wires as in the case of Example 1 were formed with a photomask, a resist pattern was peeled off, and an unnecessary seed layer was removed by etching.

Subsequently, the through-hole in which the through-electrode was formed on the side face was filled with resin A with a vacuum laminator to obtain a through-electrode substrate of Example 6 in a form as shown in FIG. 9. Here, the dielectric loss tangent of the resin A at a frequency of 20 GHz was 0.02.

A transmission loss of the through-electrode substrate of Example 6 was obtained as in the case of Example 1 and was −1.41 dB at a frequency of 20 GHz.

Example 7

The substrate A as in the case of Example 1 was prepared as a substrate of Example 7, and the substrate A was worked as in the case of Example 1 to form a through-hole, an adhesion layer, and a seed layer.

Subsequently, a dry film resist NIT915 was laminated on both the first face and second face of the substrate, a through-electrode and wires as in the case of Example 1 were formed with a photomask, a resist pattern was peeled off, and an unnecessary seed layer was removed by etching.

Subsequently, the through-hole in which the through-electrode was formed on the side face was filled with resin B with a vacuum laminator to obtain a through-electrode substrate of Example 7 in a form as shown in FIG. 9. Here, the dielectric loss tangent of the resin B at a frequency of 20 GHz was 0.01.

A transmission loss of the through-electrode substrate of Example 7 was obtained as in the case of Example 1 and was −1.33 dB at a frequency of 20 GHz.

Example 8

The substrate A as in the case of Example 1 was prepared as a substrate of Example 8, and the substrate A was worked as in the case of Example 1 to form a through-hole, an adhesion layer, and a seed layer.

Subsequently, electrolytic plating was performed by passing current between the first face side of the substrate and an anode to obtain a form in which the first face side of the substrate was sealed with copper (Cu).

Subsequently, copper (Cu) on the first face side and the second face side of the substrate was removed by CMP, and an insulating resin layer A of which the dielectric loss tangent at a frequency of 20 GHz was 0.01 was formed on the first face side of the substrate. The insulating resin layer A had an opening at a position that overlaps the through-hole in a plan view, and the opening had an opening diameter less by 10 μm than the hole diameter of the through-hole at the first face side.

Subsequently, wires were formed on the insulating resin layer A and the second face of the substrate with a dry film resist and a photomask. The wires extended from an area on the insulating resin layer A and connected with the through-electrode through the opening and further connected with the wires on the second face side of the substrate. The wire length was set to 10 mm.

A transmission loss of the through-electrode substrate of Example 8 was obtained as in the case of Example 1 and was −1.36 dB at a frequency of 20 GHz.

Example 9

The same substrate A as that of Example 1 was prepared as a substrate of Example 9.

After that, a through-electrode substrate of Example 9 was obtained as in the case of Example 8. Here, in the through-electrode substrate of Example 9, an insulating resin layer B was used instead of the insulating resin layer A. The dielectric loss tangent of the insulating resin layer B at a frequency of 20 GHz was 0.009.

A transmission loss of the through-electrode substrate of Example 9 was obtained as in the case of Example 1 and was −1.34 dB at a frequency of 20 GHz.

Example 10

The substrate A as in the case of Example 1 was prepared as a substrate of Example 10, and the substrate A was worked as in the case of Example 1 to form a through-hole, an adhesion layer, and a seed layer.

Subsequently, a dry film resist NIT915 was laminated on both the first face and second face of the substrate, a through-electrode and wires as in the case of Example 1 were formed with a photomask, a resist pattern was peeled off, and an unnecessary seed layer was removed by etching.

Subsequently, the through-hole in which the through-electrode was formed on the side face was filled with resin C with a vacuum laminator to obtain a through-electrode substrate of Example 10. The dielectric loss tangent of the resin C at a frequency of 20 GHz was 0.01.

Subsequently, a resin layer made of the resin C was formed on the first face side and the second face side of the substrate, and an opening was provided in the resin layer by UV laser at a position that overlaps the through-electrode in a plan view.

Subsequently, a dry film resist NIT915 was laminated on the resin layer made of the resin Con both first face and second face of the substrate, and wires with a wire length of 10 mm for connection with the through-electrode were formed by electrolytic plating with a photomask, to obtain a through-electrode substrate of Example 10.

A transmission loss of the through-electrode substrate of Example 10 was obtained as in the case of Example 1 and was −1.38 dB at a frequency of 20 GHz.

Example 11

The same substrate A as that of Example 1 was prepared as a substrate of Example 11.

After that, a through-electrode substrate of Example 11 was obtained as in the case of Example 10. Here, in the through-electrode substrate of Example 11, a resin D was used instead of the resin C. The dielectric loss tangent of the resin D at a frequency of 20 GHz was 0.009.

A transmission loss of the through-electrode substrate of Example 11 was obtained as in the case of Example 1 and was −1.36 dB at a frequency of 20 GHz.

Examples A1 to A12

Except that the shape of the through-hole, the thickness of the seed layer, and the thickness of the conductive layer were changed, a through-electrode substrate was manufactured as in the case of Example 1. A transmission loss was measured as in the case of Example 1. Whether there was a breakage, such as a crack, in the through-electrode was observed. Table 1 shows the configurations and evaluation results of the through-electrode substrates of Examples A1 to A12.

TABLE 1

| | Thickness T [μm] | Distance T1 [μm] | Minimum Hole Diameter [μm] | Thickness of Copper [μm] | Volume Fraction of Copper [%] | Evaluation |
|---|---|---|---|---|---|---|
| Example A1 | 400 | 30 | 35 | 7 | 36 | OK |
| Example A2 | 400 | 30 | 28 | 4 | 16 | OK |
| Example A3 | 400 | 30 | 50 | 7 | 36 | OK |
| Example A4 | 400 | 30 | 35 | 7 | 50 | OK |
| Example A5 | 400 | 30 | 35 | 7 | 20 | OK |
| Example A6 | 400 | 30 | 35 | 5 | 36 | OK |
| Example A7 | 400 | 30 | 35 | 10 | 36 | OK |
| Example A8 | 400 | 0 | 35 | 7 | 36 | OK |
| Example A9 | 400 | 50 | 35 | 7 | 36 | OK |
| Example A10 | 300 | 30 | 35 | 7 | 36 | OK |
| Example A11 | 500 | 30 | 35 | 7 | 36 | OK |
| Example A12 | 400 | 30 | 20 | 0.7 | 5 | OK |

"Thickness T" is the thickness of the substrate 10. "Distance T1" is a distance from the first face 11 to the minimum diameter part in the thickness direction of the substrate 10. In Examples A1 to A7, and A9 to A12, the narrowed part 14 is a minimum diameter part. In Example A8, a part of the through-hole 13 at the first face 11 is a minimum diameter part. "Thickness of copper" is the sum of the thickness of the seed layer 22 and the thickness of the conductive layer 23. In the column of evaluation, "OK" means that a transmission loss is sufficiently low and there is no crack.

Examples B1 to B18

The substrate was worked as in the case of Example 1 to form a through-hole. As in the case of Example 1, a through-electrode and wires were formed. Subsequently, the resin material 41 was charged into the hollow part of the through-hole. Subsequently, the insulating resin layer 42 was formed on the first face 11 and the second face 12. In this way, the through-electrode substrate shown in FIG. 8 was manufactured. A transmission loss was measured as in the case of Example 1. Whether there was a breakage, such as a crack, in the through-electrode was observed. Table 2 shows the configurations and evaluation results of the through-electrode substrates of Examples B1 to B18.

TABLE 2

| | Filled Resin | | | | Insulating Resin Layer | | | | |
|---|---|---|---|---|---|---|---|---|---|
| | Dielectric Loss Tangent | Thermogravimetric Rate of Change [%] | Thermal Expansion Coefficient [ppm] | Content of Filler [vol %] | Dielectric Loss Tangent | Thermogravimetric Rate of Change [%] | Thermal Expansion Coefficient [ppm] | Content of Filler [vol %] | Evaluation |
| Example B1 | 0.004 | 3 | 3 | 50 | 0.002 | 3 | 3 | 20 | OK |
| Example B2 | 0.0035 | 3 | 3 | 50 | 0.002 | 3 | 3 | 20 | OK |
| Example B3 | 0.003 | 3 | 3 | 50 | 0.002 | 3 | 3 | 20 | OK |
| Example B4 | 0.004 | 2 | 3 | 50 | 0.002 | 3 | 3 | 20 | OK |
| Example B5 | 0.004 | 1 | 3 | 50 | 0.002 | 3 | 3 | 20 | OK |
| Example B6 | 0.004 | 3 | 1 | 50 | 0.002 | 3 | 3 | 20 | OK |
| Example B7 | 0.004 | 3 | 5 | 50 | 0.002 | 3 | 3 | 20 | OK |
| Example B8 | 0.004 | 3 | 3 | 30 | 0.002 | 3 | 3 | 20 | OK |
| Example B9 | 0.004 | 3 | 3 | 80 | 0.002 | 3 | 3 | 20 | OK |
| Example B10 | 0.004 | 3 | 3 | 50 | 0.001 | 3 | 3 | 20 | OK |
| Example B11 | 0.004 | 3 | 3 | 50 | 0.028 | 3 | 3 | 20 | OK |
| Example B12 | 0.004 | 3 | 3 | 50 | 0.01 | 3 | 3 | 20 | OK |
| Example B13 | 0.004 | 3 | 3 | 50 | 0.002 | 2 | 3 | 20 | OK |
| Example B14 | 0.004 | 3 | 3 | 50 | 0.002 | 1 | 3 | 20 | OK |
| Example B15 | 0.004 | 3 | 3 | 50 | 0.002 | 3 | 1 | 20 | OK |
| Example B16 | 0.004 | 3 | 3 | 50 | 0.002 | 3 | 5 | 20 | OK |
| Example B17 | 0.004 | 3 | 3 | 50 | 0.002 | 3 | 3 | 5 | OK |
| Example B18 | 0.004 | 3 | 3 | 50 | 0.002 | 3 | 3 | 30 | OK |

"Thermogravimetric Rate of Change" is a rate of change in the weight of resin before and after the filled resin 41 or the resin of the insulating resin layer 42 was heated at 250° C. for an hour. "Content of Filler" is the vol % of a filler contained in the filled resin 41 or the insulating resin layer 42. In a resin having a thermal expansion coefficient of 1 ppm, ADMAFINE SO-C1 that is a silica made by Admatechs Co., Ltd. is used as a filler. In a resin having a thermal expansion coefficient of 3 ppm, ADMAFUSE FE-9 that is a silica made by Admatechs Co., Ltd. is used as a filler. In a resin having a thermal expansion coefficient of 5 ppm, ADMAFINE AO-502 that is a silica made by Admatechs Co., Ltd. is used as a filler.

REFERENCE SIGNS LIST

- 1, 2, 3, 4, 5, 6, 7 through-electrode substrate
- 10, 10A substrate
- 11 first face
- 12 second face
- 13, 13A through-hole
- 14 narrowed part
- 20A, 20B, 20C, 20D through-electrode
- 21 adhesion layer
- 22 seed layer
- 23 conductive layer
- 25 first face-side recess
- 26 second face-side recess
- 31 first face-side wire
- 32 second face-side wire
- 41 resin material
- 42 insulating resin layer
- 51, 52 opening

The invention claimed is:

1. A through-electrode substrate comprising:

a substrate having a first face and a second face opposite to the first face and having a through-hole extending from the first face to the second face; and a through-electrode located in the through-hole of the substrate, wherein a hole diameter of the through-hole varies according to a position in a thickness direction of the substrate, the through-hole has a minimum diameter part having a minimum hole diameter of greater than or equal to 10 μm, the through-hole has a maximum hole diameter of less than or equal to 60 μm, the through-electrode has an adhesion layer and a conductive layer in order from a side face of the through-hole toward a center of the through-hole, the substrate has a dielectric loss tangent of greater than or equal to 0.0002 and less than or equal to 0.0005 at a frequency of 20 GHz, the through-hole has a narrowed part that is the minimum diameter part located between the first face and the second face, a distance T1 from the first face to the narrowed part in the thickness direction is less than a distance T2 from the second face to the narrowed part in the thickness direction, the distance T1 is less than 50 μm, and a thickness of the substrate is greater than or equal to 300 μm and less than or equal to 500 μm.

2. The through-electrode substrate according to claim 1, wherein a hole diameter at the narrowed part is greater than or equal to 10 μm, a hole diameter at the first face is less than or equal to 60 μm, and a hole diameter at the second face is less than or equal to 60 μm.

3. The through-electrode substrate according to claim 1, wherein the adhesion layer contains any one of titanium (Ti), titanium nitride (TiN), and zinc oxide (ZnO).

4. The through-electrode substrate according to claim 1, wherein the conductive layer contains copper (Cu).

5. The through-electrode substrate according to claim 1, wherein the through-hole is sealed with a conductive material at the first face side of the substrate or the second face side of the substrate.

6. The through-electrode substrate according to claim 1, wherein an inside of the through-hole is filled with a conductive material, the conductive material has a first face-side recess at the first face side of the substrate, and a second face-side recess at the second face side of the substrate, a depth of the first face-side recess from the first face of the substrate is greater than or equal to 0.1 μm and less than or equal to 5 μm, and a depth of the second face-side recess from the second face of the substrate is greater than or equal to 0.1 μm and less than or equal to 5 μm.

7. The through-electrode substrate according to claim 1, wherein an inside of the through-hole is filled with a resin material, and the resin material has a dielectric loss tangent of greater than or equal to 0.003 and less than or equal to 0.02 at a frequency of 20 GHz.

8. The through-electrode substrate according to claim 7, wherein a resin layer made of the resin material is formed on at least one of the first face side of the substrate and the second face side of the substrate, and the resin layer has an opening at a position that overlaps the through-electrode in a plan view.

9. The through-electrode substrate according to claim 1, further comprising an insulating resin layer provided on at least one of the first face side of the substrate and the second face side of the substrate, wherein the insulating resin layer includes a resin material having a dielectric loss tangent of greater than or equal to 0.001 and less than or equal to 0.01 at a frequency of 20 GHz.

10. The through-electrode substrate according to claim 9, wherein the insulating resin layer has an opening at a position that overlaps the through-electrode in a plan view.

11. The through-electrode substrate according to claim 1, wherein the minimum diameter part has a minimum hole diameter of greater than or equal to 25 μm.

12. The through-electrode substrate according to claim 1, wherein a content of silicon dioxide in the substrate is higher than or equal to 90 wt %.

13. The through-electrode substrate according to claim 1, wherein the through-electrode contains copper, and a volume fraction of copper in the through-hole is lower than or equal to 50%.

14. The through-electrode substrate according to claim 1, wherein a surface roughness of the side face of the through-hole is less than or equal to 5 nm.

* * * * *